United States Patent
Kang et al.

(10) Patent No.: US 11,031,088 B2
(45) Date of Patent: Jun. 8, 2021

(54) HOT-COLD VTH MISMATCH USING VREAD MODULATION

(71) Applicant: SANDISK TECHNOLOGIES LLC, Addison, TX (US)

(72) Inventors: Dae Wung Kang, Los Gatos, CA (US); Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/909,830

(22) Filed: Jun. 23, 2020

(65) Prior Publication Data

US 2020/0321061 A1    Oct. 8, 2020

Related U.S. Application Data

(63) Continuation of application No. 16/248,000, filed on Jan. 15, 2019, now Pat. No. 10,726,926.

(60) Provisional application No. 62/739,195, filed on Sep. 29, 2018.

(51) Int. Cl.
| | |
|---|---|
| *G11C 16/26* | (2006.01) |
| *G11C 7/04* | (2006.01) |
| *G11C 16/04* | (2006.01) |
| *G11C 11/4074* | (2006.01) |
| *G11C 11/56* | (2006.01) |

(52) U.S. Cl.
CPC ........... *G11C 16/26* (2013.01); *G11C 7/04* (2013.01); *G11C 11/4074* (2013.01); *G11C 11/5642* (2013.01); *G11C 16/0483* (2013.01)

(58) Field of Classification Search
None
See application file for complete search history.

(56) References Cited

U.S. PATENT DOCUMENTS

| | | |
|---|---|---|
| 9,330,790 B2 | 5/2016 | Kim |
| 9,543,028 B2 | 1/2017 | Ray |
| 9,711,229 B1 | 7/2017 | Rabkin |

(Continued)

OTHER PUBLICATIONS

Office Action dated Nov. 19, 2019, U.S. Appl. No. 16/248,000.

(Continued)

*Primary Examiner* — Tan T. Nguyen
(74) *Attorney, Agent, or Firm* — Vierra Magen Marcus LLP

(57) ABSTRACT

Methods and systems for improving the reliability of data stored within a semiconductor memory over a wide range of operating temperatures are described. The amount of shifting in the threshold voltages of memory cell transistors over temperature may depend on the location of the memory cell transistors within a NAND string. To compensate for these variations, the threshold voltages of memory cell transistors in the middle of the NAND string or associated with a range of word lines between the ends of the NAND string may be adjusted by increasing the word line voltages biasing memory cell transistors on the drain-side of the selected word line when the read temperature is greater than a first threshold temperature and/or decreasing the word line voltages biasing memory cell transistors on the source-side of the selected word line when the read temperature is less than a second threshold temperature.

20 Claims, 18 Drawing Sheets

(56) References Cited

U.S. PATENT DOCUMENTS

| | | |
|---|---|---|
| 2008/0094930 A1 | 4/2008 | Mokhlesi |
| 2008/0247253 A1 | 10/2008 | Nguyen |
| 2009/0323400 A1 | 12/2009 | Shinozaki |
| 2011/0134704 A1* | 6/2011 | Lee .................. G11C 16/06 365/185.22 |
| 2015/0213903 A1* | 7/2015 | Shiino ............... G11C 16/3427 365/185.17 |
| 2018/0293029 A1 | 10/2018 | Achtenberg |
| 2019/0371402 A1 | 12/2019 | Lin |

OTHER PUBLICATIONS

Response to Office Action dated Feb. 19, 2020, U.S. Appl. No. 16/248,000.

Notice of Allowance dated Mar. 18, 2020, U.S. Appl. No. 16/248,000.

* cited by examiner (Prior Art)

US 11,031,088 B2

HOT-COLD VTH MISMATCH USING VREAD MODULATION

CLAIM OF PRIORITY

The present application is a continuation of U.S. patent application Ser. No. 16/248,000, entitled "Improving Hot-Cold VTH Mismatch Using VREAD Modulation," filed Jan. 15, 2019, which claims priority to U.S. Provisional Application No. 62/739,195, entitled "Improving Hot-Cold VTH Mismatch Using VREAD Modulation," filed Sep. 29, 2018, which are herein incorporated by reference in their entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (e.g., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased variability in memory cell characteristics over temperature.

DETAILED DESCRIPTION

Figure 1:
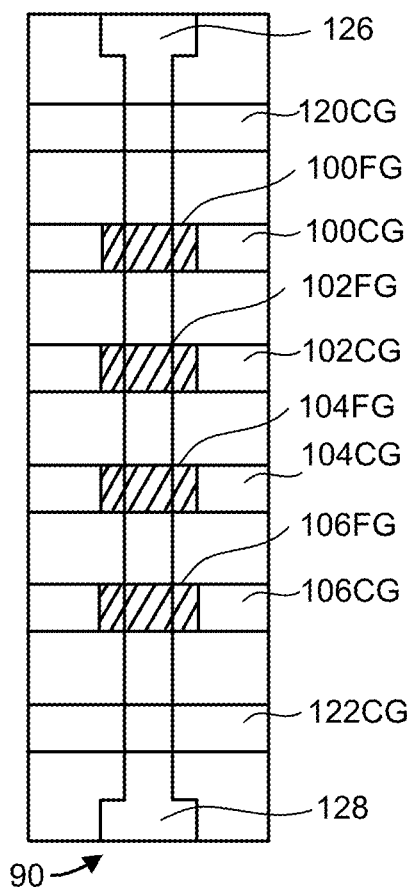
FIG. 1 depicts one embodiment of a NAND string.

Technology is described for improving the reliability of data stored within a semiconductor memory (e.g., a NAND-type flash memory) over a wide range of operating temperatures. One issue with using NAND strings (e.g., vertical NAND strings) with poly-crystalline silicon (or poly-silicon) channels is that the variations in stored threshold voltages over temperature are increased relative to NAND strings that use crystalline silicon channels. The amount of shifting in the threshold voltages over temperature may depend on the word line location for the memory cell transistors. For example, the threshold voltages for memory cell transistors located near a drain-side end of a NAND string may shift by −7 mV per degree Celsius while other memory cell transistors located near the middle of the NAND string may shift by −5 mV per degree Celsius. In some cases, to compensate for these threshold voltage variations over temperature and word line location, the threshold voltages of memory cell transistors in the middle of a NAND string or associated with a range of word lines within the NAND string between the ends of the NAND string (e.g., between word lines WL24 and WL39 out of 64 word lines from WL0 to WL63) may be adjusted by increasing the word line voltages (e.g., the VREAD voltages or unselected word line voltages applied to the drain-side transistors during a sensing operation) biasing memory cell transistors on the drain-side of the selected word line when the read temperature is greater than a first threshold temperature (e.g., is greater than 55 degrees Celsius) and/or decreasing the word line voltages biasing memory cell transistors on the source-side of the selected word line when the read temperature is less than a second threshold temperature (e.g., is less than 25 degrees Celsius). The second threshold temperature may be less than the first threshold temperature.

Increasing the word line voltages biasing memory cell transistors on the drain-side of the selected word line when the read temperature is greater than the first threshold temperature may effectively reduce the stored or sensed threshold voltage for a memory cell transistor connected to the selected word line due to drain-induced barrier lowering (DIBL); lowering the resistance on the drain-side of the NAND string may increase the drain voltage applied to the selected memory cell transistor and lower the effective threshold voltage of the selected memory cell transistor due to DIBL. Decreasing the word line voltages biasing memory cell transistors on the source-side of the selected word line when the read temperature is less than the second threshold temperature may effectively increase the stored or sensed threshold voltage for the memory cell transistor connected to the selected word line due to increased body effect and/or having a higher source line voltage; increasing the resistance on the source-side of the NAND string may increase the source side of the selected memory cell transistor and increase the effective threshold voltage of the selected memory cell transistor. The adjustments made to the stored threshold voltages of memory cell transistors in the middle of the NAND string or within a range of word lines within the NAND string may reduce the word line dependence on the stored threshold voltages over temperature and/or may be used to make the shifting in stored threshold voltages over temperature more uniform (e.g., the threshold voltages for each of the memory cell transistors of a NAND string may shift by −6 mV per degree Celsius). One benefit of making the shifting in threshold voltages over temperature more uniform over memory cell location within a NAND string is that source line compensation may be more effective and the number of bit errors may be reduced.

In some embodiments, the stored threshold voltage for a memory cell transistor in a NAND string may be reduced by lowering the resistance on the drain-side of the memory cell transistor (e.g., by increasing the word line voltages applied to the transistors on the drain-side of the memory cell transistor) or increased by increasing the resistance on the source-side of the memory cell transistor (e.g., by reducing the word line voltages applied to the source-side transistors). As the change in threshold voltage over the change in temperature (e.g., $Tco=\Delta Vth/\Delta T$) may depend on the location of the memory cell transistor within the NAND string (e.g., whether the memory cell transistor is positioned close to the bit line side of the NAND string, close to the source line side of the NAND string, or in the middle of the NAND string), the threshold voltage compensation applied to the memory cell transistor may be determined based on both the read temperature and the location of the memory cell transistor within the NAND string. The location of the memory cell transistor within the NAND string may be determined based on the word line address of the word line connected to the gate of the memory cell transistor.

In some embodiments, the memory cell transistors of a NAND string may be assigned to one of a plurality of groups (e.g., to one of three groupings of memory cell transistors). Each group of the plurality of groups may correspond with a range of word line addresses. In one example, a first group of the plurality of groups may correspond with memory cell transistors between word lines WL0-WL23, a second group of the plurality of groups may correspond with memory cell transistors between word lines WL24-WL39, and a third group of the plurality of groups may correspond with memory cell transistors between word lines WL40-WL63. The memory cell transistor associated with word line WL0 may be closest to the source-side end of the NAND string and the memory cell transistor associated with word line WL63 may be closest to the drain-side end of the NAND string. When reading at a first read temperature (e.g., at a temperature below 25 degrees Celsius), only the threshold voltages of memory cell transistors within the first group may be adjusted or reduced by increasing DIBL for the memory cell transistors within the first group. When reading at a second read temperature (e.g., at a temperature above 65 degrees Celsius), the threshold voltages of memory cell transistors within the first group may be reduced by a first amount by increasing DIBL for the memory cell transistors within the first group and the threshold voltages of memory cell transistors within the second group may be reduced by a second amount less than the first amount by increasing DIBL for the memory cell transistors within the second group. In this case, when the first group of memory cell transistors are read, a first word line voltage may be applied to memory cell transistors on the drain-side of the first group and when the second group of memory cell transistors are read, a second word line voltage less than the first word line voltage may be applied to memory cell transistors on the drain-side of the second group.

In some embodiments, the threshold voltages of memory cell transistors in the middle of a NAND string or associated with a range of word lines within the NAND string between the ends of the NAND string may be adjusted by decreasing the word line voltages (e.g., the VREAD voltages) biasing memory cell transistors on the drain-side of the selected word line when the read temperature is greater than a first threshold temperature (e.g., is greater than 75 degrees Celsius) and/or increasing the word line voltages biasing memory cell transistors on the source-side of the selected word line when the read temperature is less than a second threshold temperature (e.g., is less than 15 degrees Celsius). The second threshold temperature may be less than the first threshold temperature.

A hot temperature may correspond with a temperature above a first threshold temperature, such as 70 degrees Celsius. A cold temperature may correspond with a temperature below a second threshold temperature that is less than the first threshold temperature, such as 20 degrees Celsius. Chip temperature during a read or programming operation may be determined or sensed using an on-chip temperature sensor (e.g., a bandgap-based temperature sensor). The temperature sensor may be in communication with one or more control circuits for performing or facilitating one or more memory array operations including erasing, programming, or reading operations.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate. The circuitry associated with the operation of the memory cells may be located above the memory cells or located below the memory cells.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
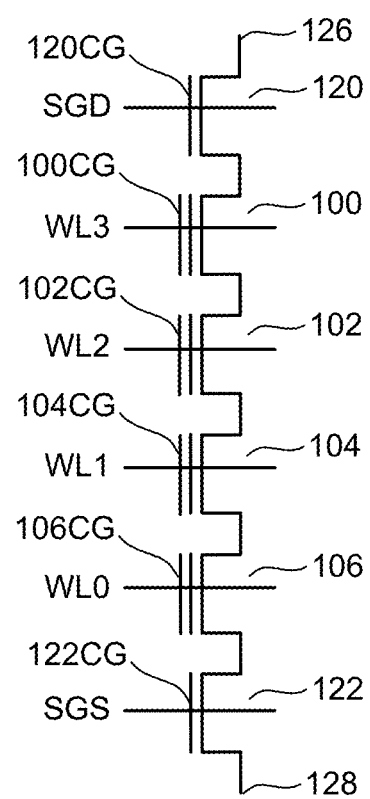
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

One architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

The technology disclosed herein may be applied to various types of non-volatile storage devices and architectures (e.g., NAND-type flash memory). The types of memory cell transistors in a NAND string may comprise floating-gate transistors or charge trapping transistors. The memory cell transistors in a NAND string may employ charge trapping, phase-change (e.g., chalcogenide materials), or state-change materials. The memory cell transistors in a NAND string may comprise floating-gate memory cell transistors, charge trap transistors, ferroelectric memory (e.g., FeRAM) transistors, or magnetoresistive memory (e.g., MRAM) transistors.

A person of ordinary skill in the art will recognize that the technology described herein is not limited to a single specific memory structure, but covers many relevant memory structures within the spirit and scope of the technology as described herein and as understood by one of ordinary skill in the art.

Figure 3A:
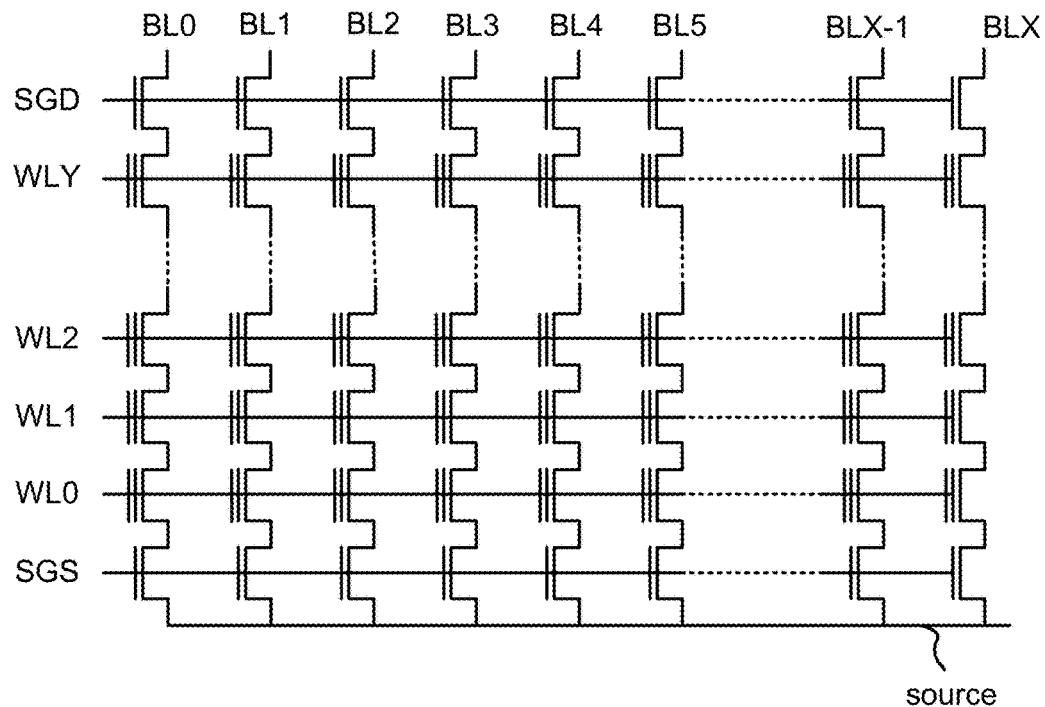
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die.

Therefore, from an integrated circuit area standpoint, it may be beneficial to only use one drain-side selection gate for each NAND string and then connect each NAND string of the pair with only one of the two drain-side selection signals.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage (e.g., a selected word line voltage), a level of which is specified for each read and verify operation in order to determine whether a threshold voltage of a particular memory cell has reached such level. The transistors on the drain-side and source-side of the particular memory cell being sensed may be set into a conducting state during the sensing operation (e.g., the read or verify operation) so that a determination regarding whether the threshold voltage of the particular memory cell has been reached may be made. After applying the selected word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor (e.g., an integration capacitor) in a sense amplifier. In another example, the conduction current of the selected memory cell allows (or fails to allow) the NAND string that included the memory cell to discharge a voltage on the corresponding bit line. The voltage of the bit line may be measured after a period of time (e.g., after a sensing time during which the bit line has been discharged) to determine whether the bit line has been discharged by a particular amount or not.

Figure 3B:
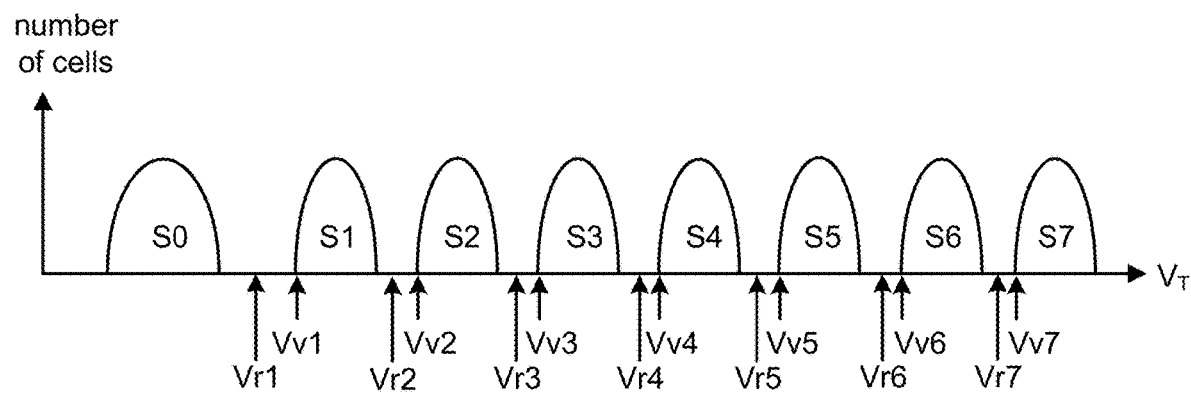
FIG. 3B depicts one embodiment of possible threshold voltage distributions (or data states) for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
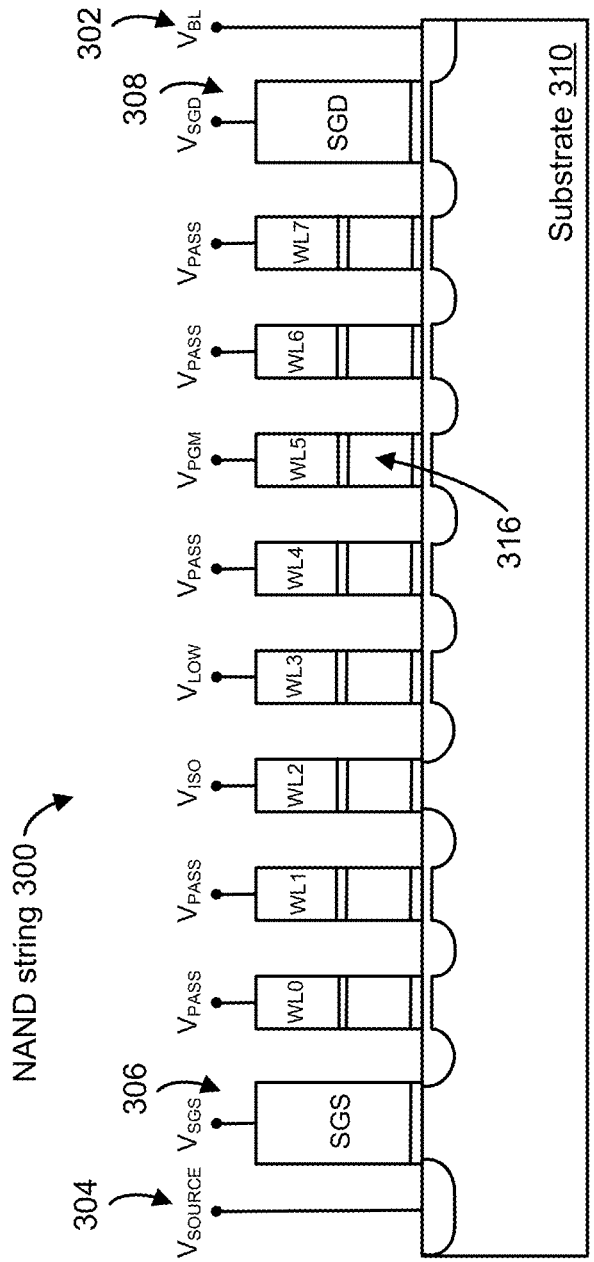
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a substrate 310. VSGS may be applied to the source-side select gate 306 and $V_{SGD}$ may be applied to the drain-side select gate 308. The bit line 302 may be biased to VBA and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

Figure 3D:
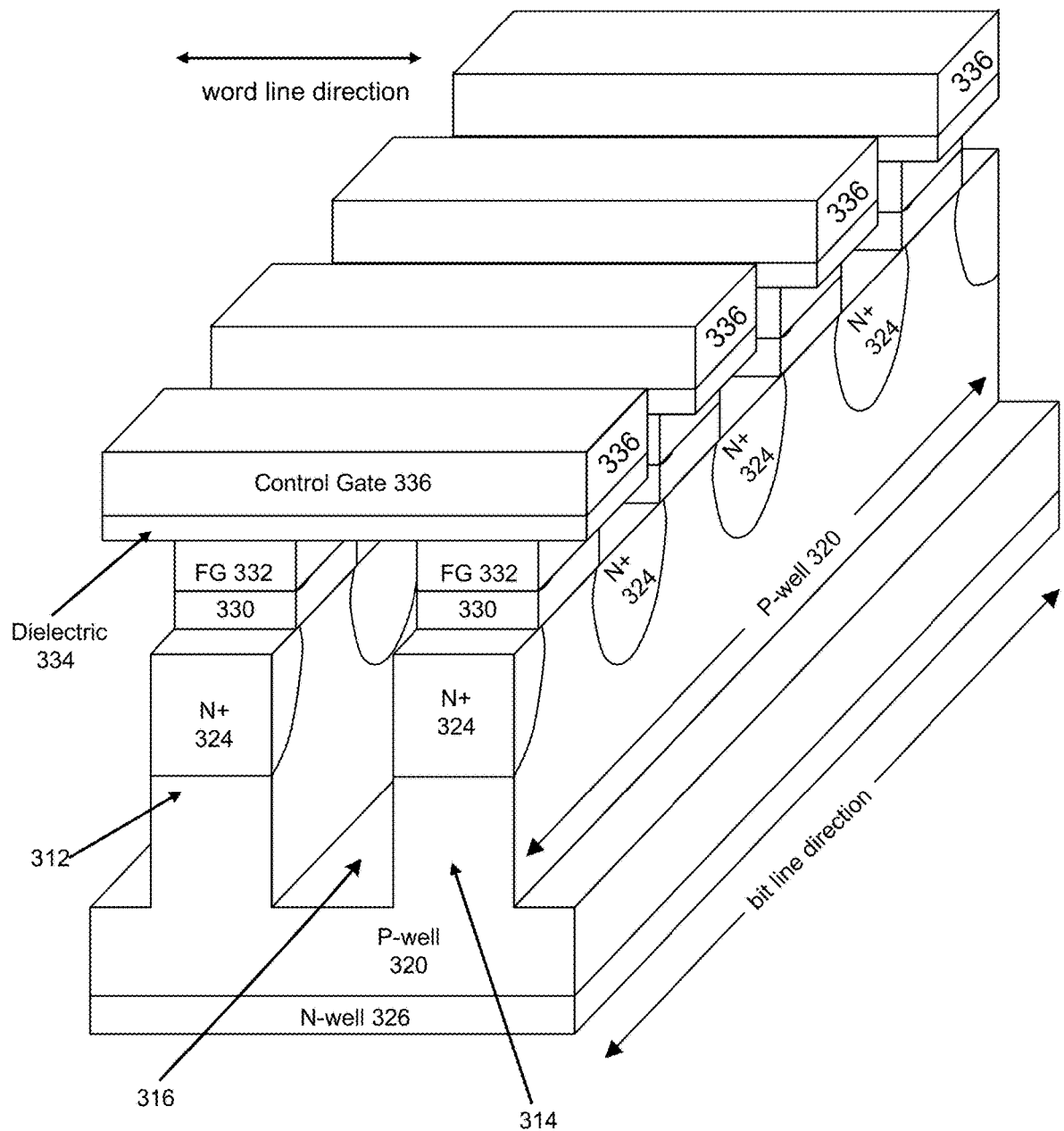
FIG. 3D depicts one embodiment of two NAND strings that may be fabricated as part of a larger flash memory array.

FIG. 3D depicts one embodiment of two NAND strings 312 and 314 that may be fabricated as part of a larger flash memory array. As depicted, NAND strings 312 and 314 each include four memory cells, n-type diffusions 324, and a portion of a shared P-well 320. Each memory cell in a NAND string corresponds with a floating gate 332 isolated by dielectric layers 334 and 330. N-well 326 is below P-well 320. The bit line direction (or y-direction) runs in the direction of the NAND strings, and the word line direction (or x-direction) runs perpendicular to the NAND strings or the bit line direction. The word line direction may be referred to as the row direction and the bit line direction may be referred to as the column direction. In some cases, a bit line associated with a NAND string may run in the bit line direction on top of (or over) the NAND string in a direction perpendicular to the word line direction. In some cases, the N-well 326 may sit in a P-type substrate (not depicted). As depicted, NAND string 312 is separated from NAND string 314 by an isolation region 316. The isolation region 316 may include an insulating material or dielectric between adjacent NAND strings (not depicted). Typically, shallow trench isolation (STI) is used to isolate adjacent NAND strings (e.g., using an active area STI). In one embodiment, the control gates 336 correspond with word lines, such as word lines WL0-WLY of FIG. 3A.

Figure 4A:
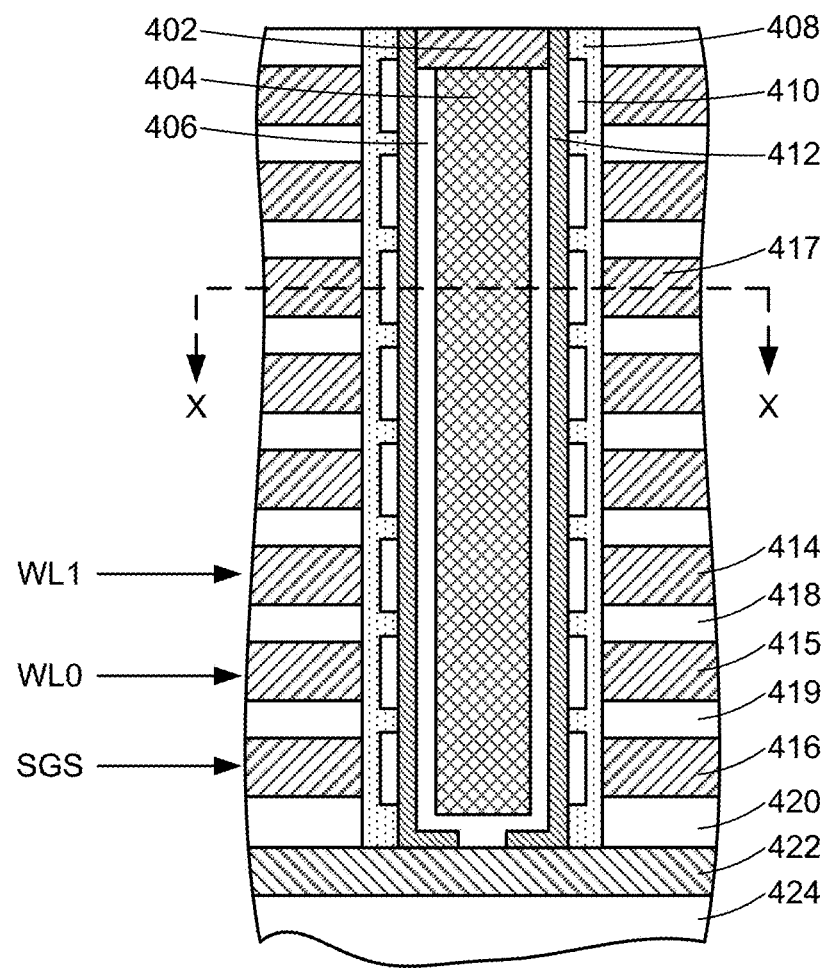
FIG. 4A depicts one embodiment of a vertical NAND structure.

FIG. 4A depicts one embodiment of a vertical NAND structure. The vertical NAND structure includes a vertical NAND string formed above the substrate 424 and oriented such that the vertical NAND string is orthogonal to the substrate 424. The vertical NAND string may be arranged within a vertical memory hole that is etched through alternating layers of control gate material (e.g., tungsten or polysilicon) and inter-gate insulator material (e.g., oxide or silicon oxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a dielectric material 408 (e.g., oxide or a stack of dielectric layers, such as layers of $Al_2O_3$ and $SiO_2$), a floating gate material 410 (e.g., polysilicon), a tunneling layer material 412 (e.g., a thin oxide), and a channel layer material 406 (e.g., undoped polysilicon) may be deposited within the memory hole and arranged in order to form the vertical NAND string. The tunneling layer material 412 may comprise a portion of a multi-layer dielectric stack such as an ONO dielectric stack, which includes alternating layers of silicon dioxide ("O") and silicon nitride ("N"). In some cases, a core material layer 404 (e.g., oxide) may be formed within the memory hole. In other cases, the core material layer 404 may be omitted. A bit line contact layer 402 may be formed at the top of the memory hole and connect to the channel layer material 406. The channel layer material 406 may connect to the source line layer 422 at the bottom of the memory hole. Thus, in this case, the bit line contact layer 402 connects to the vertical NAND string at the top of the memory hole and the source line contact layer 422 connects to the vertical NAND string at the bottom of the memory hole. In some embodiments, the floating gate material 410 may be replaced with a charge storage material or a charge trapping layer (e.g., silicon nitride).

Figure 4B:
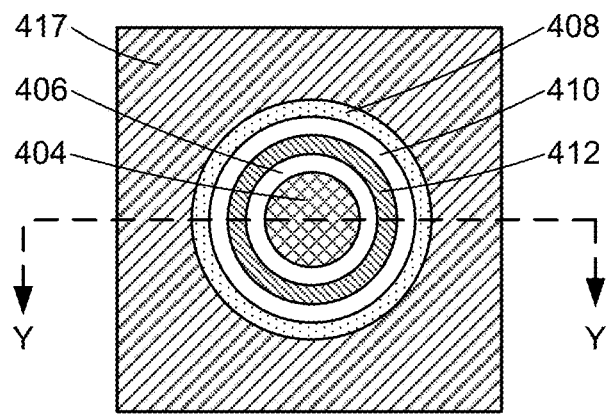
FIG. 4B depicts one embodiment of a cross-sectional view taken along line X-X of FIG. 4A.

FIG. 4B depicts one embodiment of a cross-sectional view taken along line X-X of FIG. 4A. As depicted, the vertical NAND string includes an inner core material layer 404 that is surrounded by the channel layer material 406 that is surrounded by the tunneling layer material 412 that is surrounded by the floating gate material 410 that is surrounded by the dielectric material 408 that is surrounded by the control gate material layer 417. In one embodiment, FIG. 4A may depict a cross-sectional view taken along line Y-Y of FIG. 4B. In one embodiment, the vertical NAND string may be formed using a vertical cylindrical structure or a vertical tapered cylindrical structure. In this case, the dielectric material 408, floating gate material 410, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure.

Figure 5:
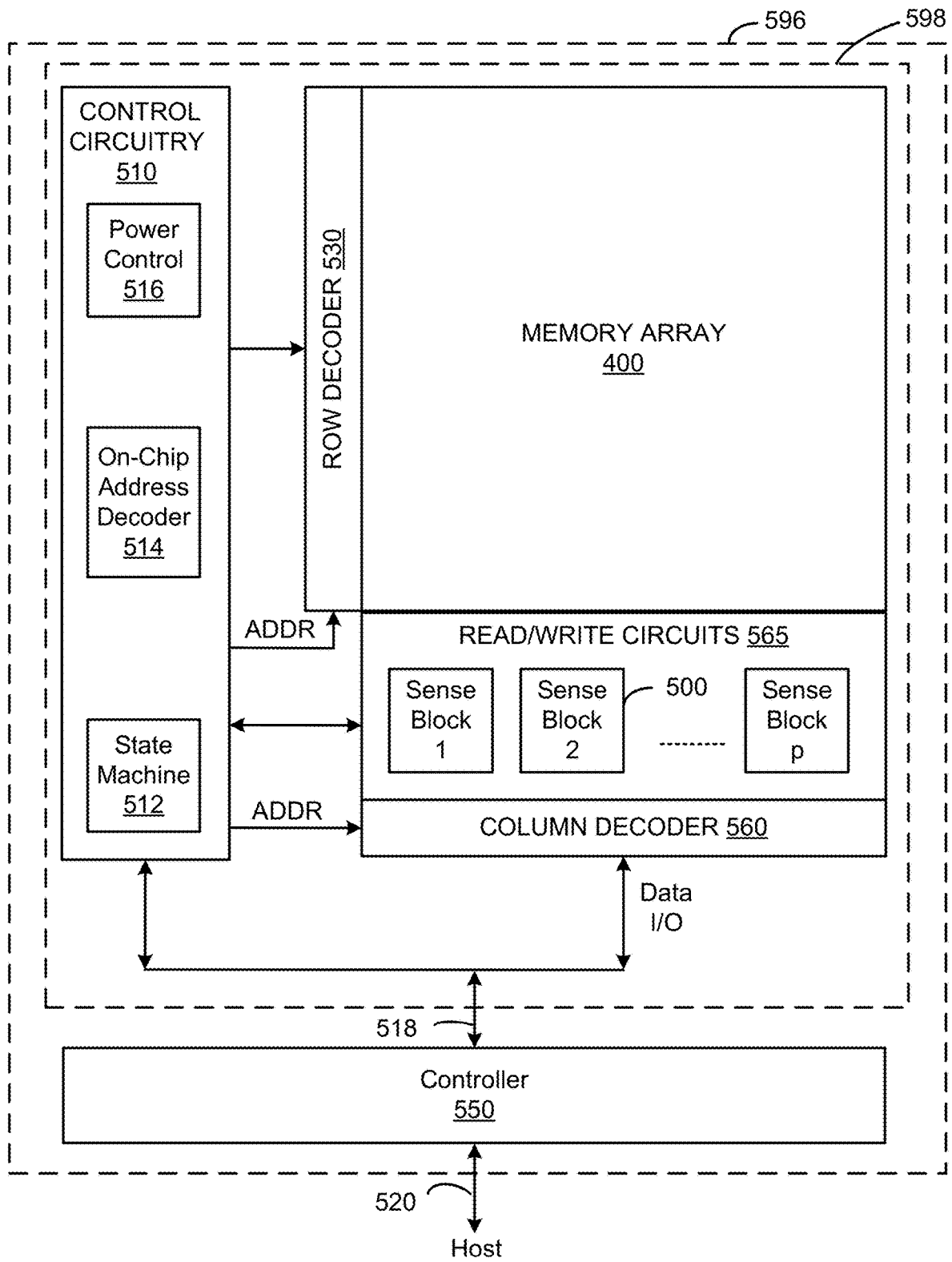
FIG. 5 depicts one embodiment of a non-volatile storage system including read/write circuits for reading and programming a page

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits or the one or more control circuits may perform or facilitate one or more memory array operations including erasing, programming, or reading operations. The sense blocks 500 or the read/write circuits 565 may comprise sensing circuits. The sense blocks 500, read/write circuits 565, and/or other sensing circuitry arranged on the memory die 598 may comprise representative examples of means for determining a set of threshold voltages for a plurality of memory cells based on a sensing time. The sense blocks 500 may include sensing circuitry for determining a stored data state for a memory cell or a sensed threshold voltage associated with the stored data state.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
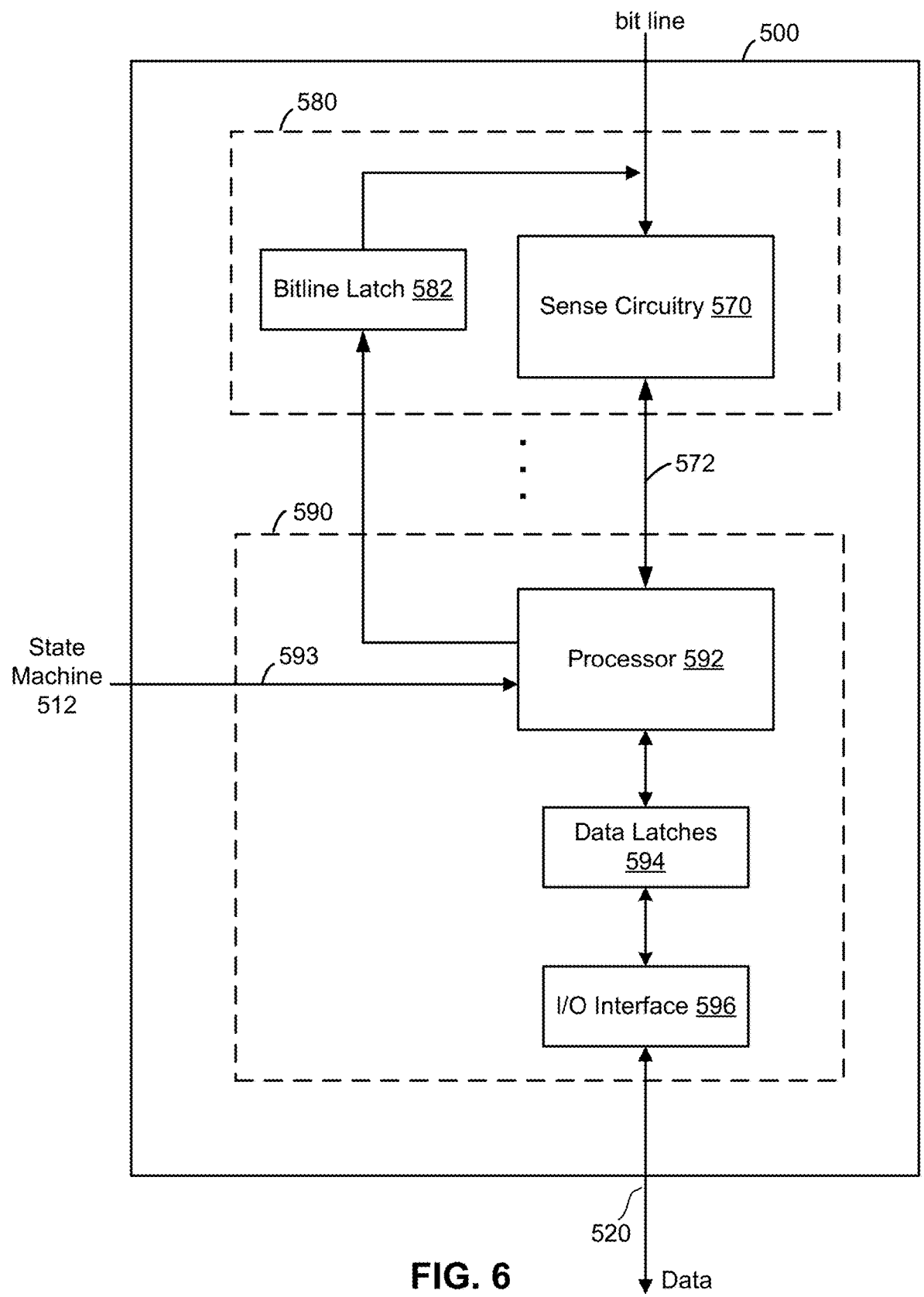
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating a program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages or word line voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
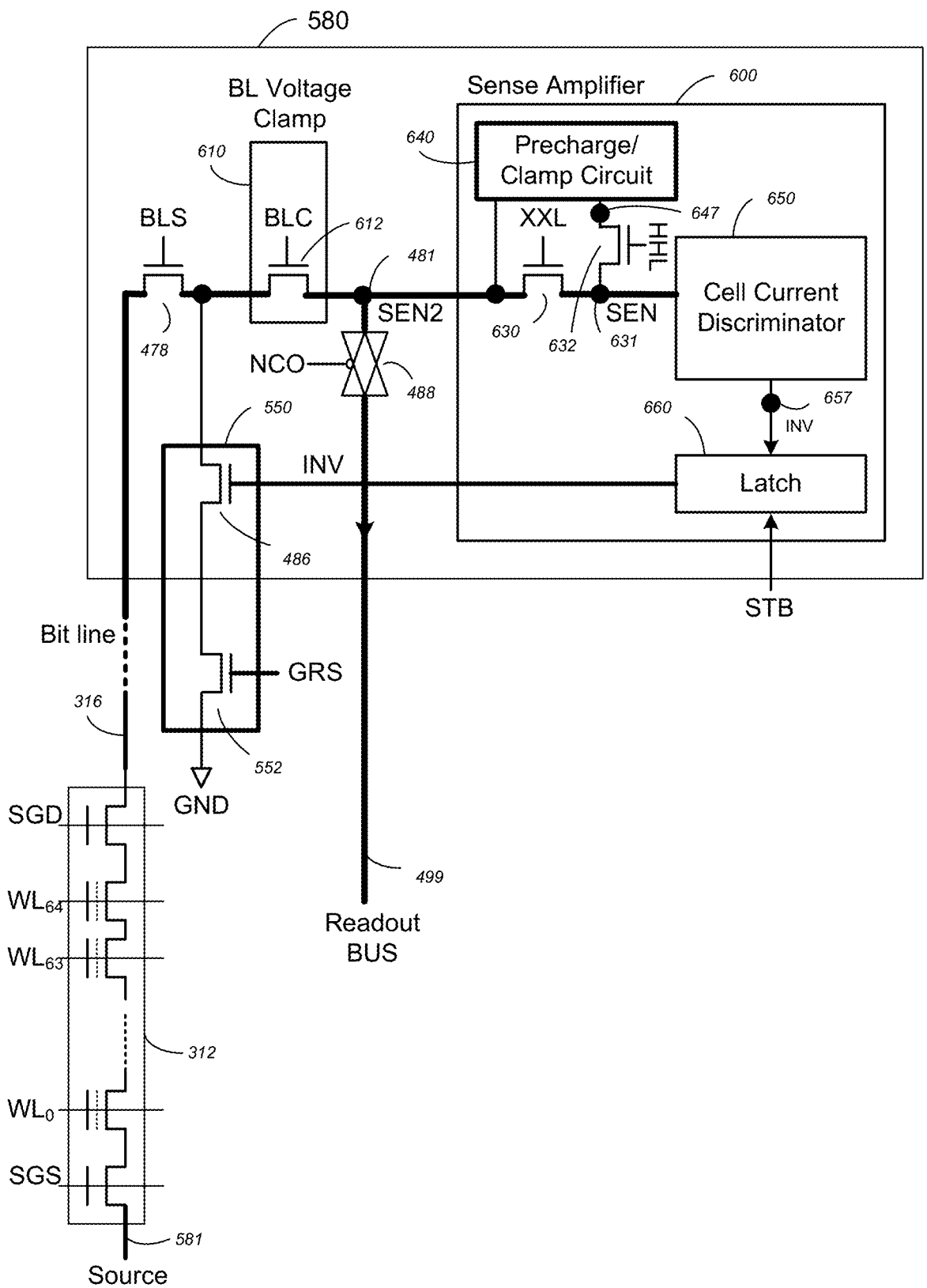
FIG. 7A depicts one embodiment of a sense module.

FIG. 7A depicts one embodiment of a sense module, such as sense module 580 in FIG. 6. As depicted, the sense module may sense the conduction current of a memory cell in a NAND string 312 via a coupled bit line 316. Sense module 580 has a sense node 481 that can be selectively coupled to a bit line, a sense amplifier 600, and a readout bus 499. An isolation transistor 478, when enabled by a signal BLS, connects the bit line 316 to the sense node 481. The sense amplifier 600 senses the sense node 481. Sense amplifier 600 includes a pre-charge/clamp circuit 640, a cell current discriminator 650, and a latch 660. One embodiment of a pre-charge/clamp circuit 640 is described later in reference to FIG. 7B. One embodiment of a cell current discriminator 650 is described later in reference to FIG. 7C.

In one embodiment, sense module 580 controls the voltages and limiting currents applied to bit line 316 and senses the conduction current of a selected memory cell in the NAND string 312. The sense module 580 may include a pull-down circuit 550, which includes transistors 486 and 552, for selectively pulling the bit line 316 to ground. The pull-down circuit 550 is activated when both the signal INV and another signal GRS are both HIGH. The sense module 580 may include a bit line voltage clamp 610, which may clamp the bit line voltage during sensing. Bit line voltage clamp 610 may operate as a source-follower with transistor 612 in series with the bit line 316. BLC may be set to roughly a threshold voltage above the desired bit line voltage (e.g., 0.5V or 0.7V) during sensing. The source 581 of the NAND string 312 may be set to 0V or another bias voltage (e.g., 100 mV) during sensing of the conduction current of the selected memory cell.

Figure 7B:
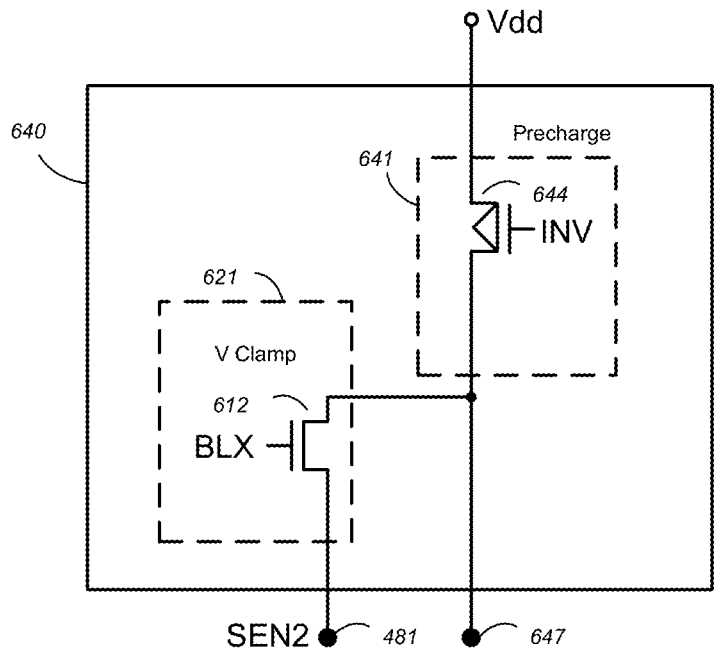
FIG. 7B depicts one embodiment of a pre-charge/clamp circuit.

FIG. 7B depicts one embodiment of a pre-charge/clamp circuit, such as pre-charge/clamp circuit 640 in FIG. 7A. The pre-charge/clamp circuit has a voltage clamp 621 component and a pre-charge circuit 641 component. The voltage clamp 621 is implemented by a transistor 612 controlled by an analog signal BLX at its gate. BLX is such that it ensures sufficient voltage on the node SEN2 481 (see FIG. 7A) so that the bit line voltage clamp 610 can function properly. The pre-charge circuit 641 is implemented by transistor 644 controlled by the signal INV at its gate.

Referring to FIG. 7A, when the selected gate voltage (e.g., a predetermined threshold voltage level) applied to a selected word line is stable, then the conduction current or the programmed threshold voltage of the selected memory cell can be sensed via the coupled bit line 316 via the transistor 630 gated by a signal XXL.

Figure 7C:
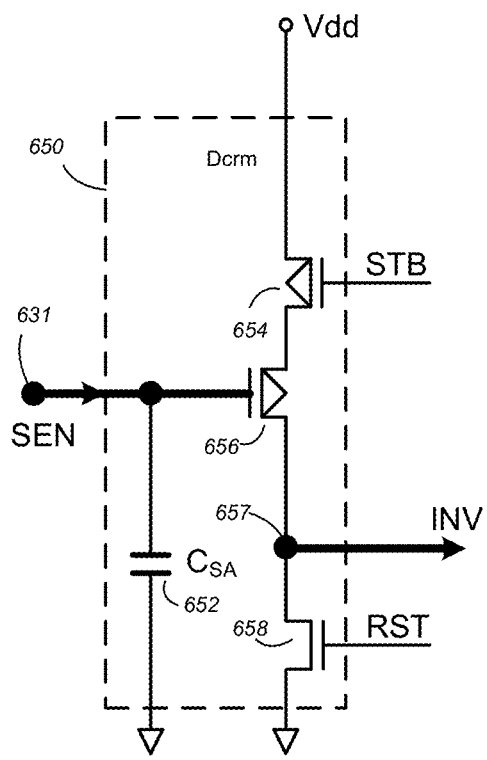
FIG. 7C depicts one embodiment of a cell current discriminator circuit.

FIG. 7C depicts one embodiment of a cell current discriminator circuit, such as cell current discriminator circuit 650 in FIG. 7A. The cell current discriminator 650 serves as a discriminator or comparator of current levels. It is coupled to the sense node to sense the conduction current in the memory cell. Cell current discriminator 650 includes a capacitor 652, p-channel transistor 656, transistors 654 and transistor 658. The cell current discriminator indirectly measures the conduction current of a memory cell by the rate it charges or discharges the capacitor 652. This is accomplished by sensing the signal SEN at the node 631. The signal SEN controls the gate of the p-transistor 656. Prior to sensing, SEN is pre-charged to VDD (HIGH) by the pre-charge circuit 641. Referring to FIG. 7A, the pre-charge is enabled by a signal HHL turning on the coupling transistor 632 so that the node SEN 631 is coupled to the pre-charge circuit 641 at node 647. Sensing is then accomplished by measuring the memory cell's conduction current by the rate it discharges the capacitor 652.

In one embodiment, during sensing, the conduction current of the selected memory cell will discharge the capacitor 652. The voltage of the node SEN will then decrease from VDD at a rate depending on the conduction current. After a predetermined discharging period (or sensing time), SEN will drop to some value that may or may not turn on the measuring p-transistor 656. If it drops sufficiently low to turn on the p-transistor 656, it will mean that the conduction current is higher than the reference current. This will also result in the INV signal being pulled HIGH when the signal STB is asserted. On the other hand, if the transistor 656 is not turned on at the end of the sensing period, the conduction current is lower than the reference current and the signal INV will be LOW. Referring to FIG. 7A, the end of the sensing period is marked by decoupling the bit line from the SEN node with XXL turning off the coupling transistor 630. The sensed result is then latched into the latch 660 based on a strobe signal STB. After the sensed result has been latched, signal NCO may be used to pass the state of the sense node 481 to the readout bus 499 via transfer gate 488.

In another embodiment, a cell current discriminator circuit may include a current mirror, which mirrors the current through the bit line, and a comparator which compares the mirrored current with a reference current. In some cases, a target reference current (or target cell current) may be injected into the bit line (or a sensing node) in order to facilitate current sensing. In some cases, the cell current discriminator circuit may include a differential amplifier for comparing the voltage associated with a sensed result with a reference voltage and determining the state of a memory cell based on the comparison.

Figure 8A:
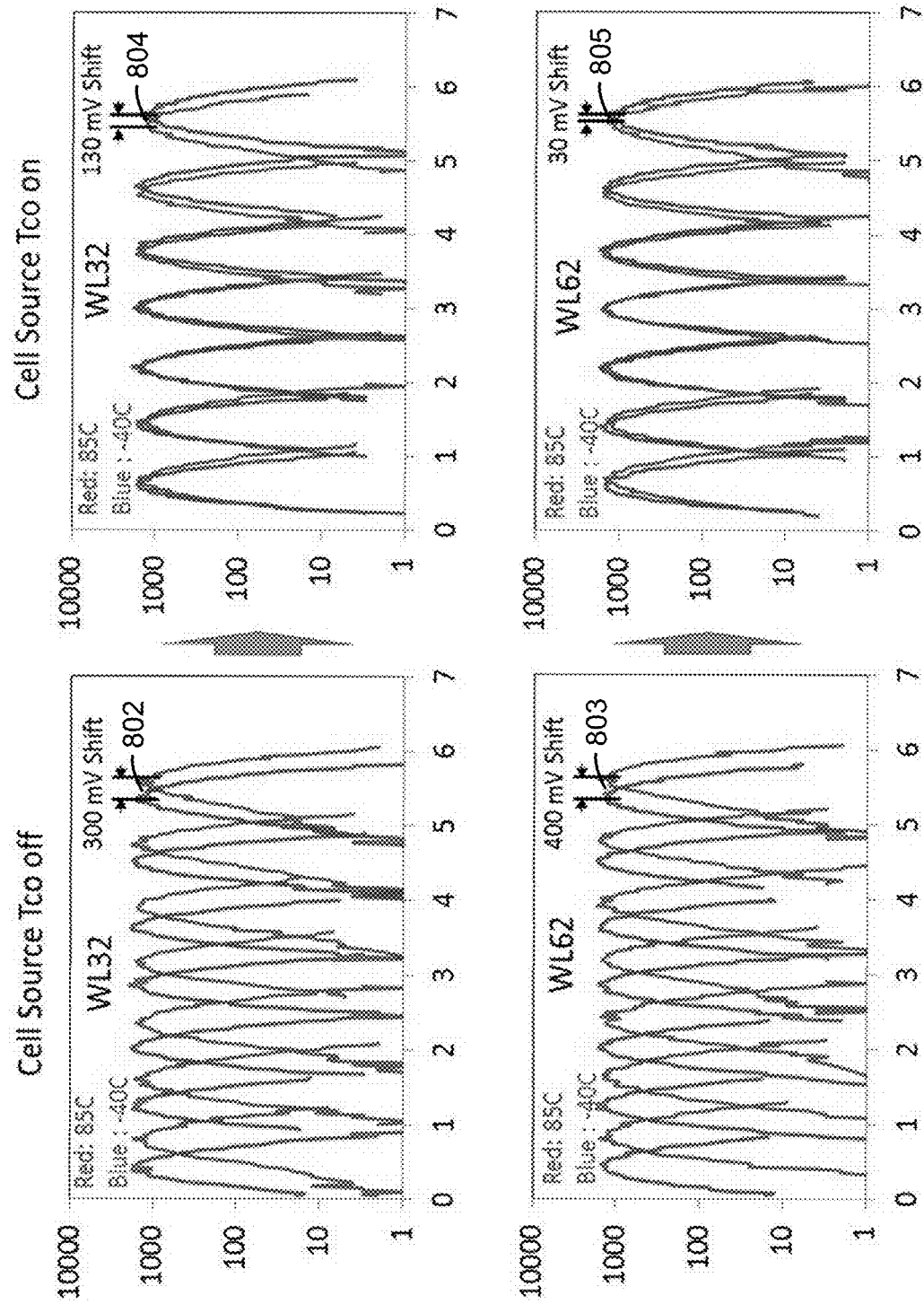
FIG. 8A depicts memory cell threshold voltage distributions with and without temperature compensation of the source line voltage.

FIG. 8A depicts memory cell threshold voltage distributions with and without temperature compensation of the source line voltage for memory cell transistors connected to a middle word line (WL32) and a drain-side word line (WL62) out of word lines WL0 through WL63. As depicted, the threshold voltage shift over temperature range between −40 degrees Celsius and 85 degrees Celsius for the memory cell transistors connected to the word line WL32 without temperature compensation 802 is 300 mV and with temperature compensation 804 is 130 mV. The threshold voltage shift over temperature range between −40 degrees Celsius and 85 degrees Celsius for the memory cell transistors connected to the word line WL62 without temperature compensation 803 is 400 mV and with temperature compensation 805 is 30 mV. Thus, temperature compensation of the source line voltage is not able to remove the word line dependence on the amount of shifting in the threshold voltage distributions.

Figure 8B:
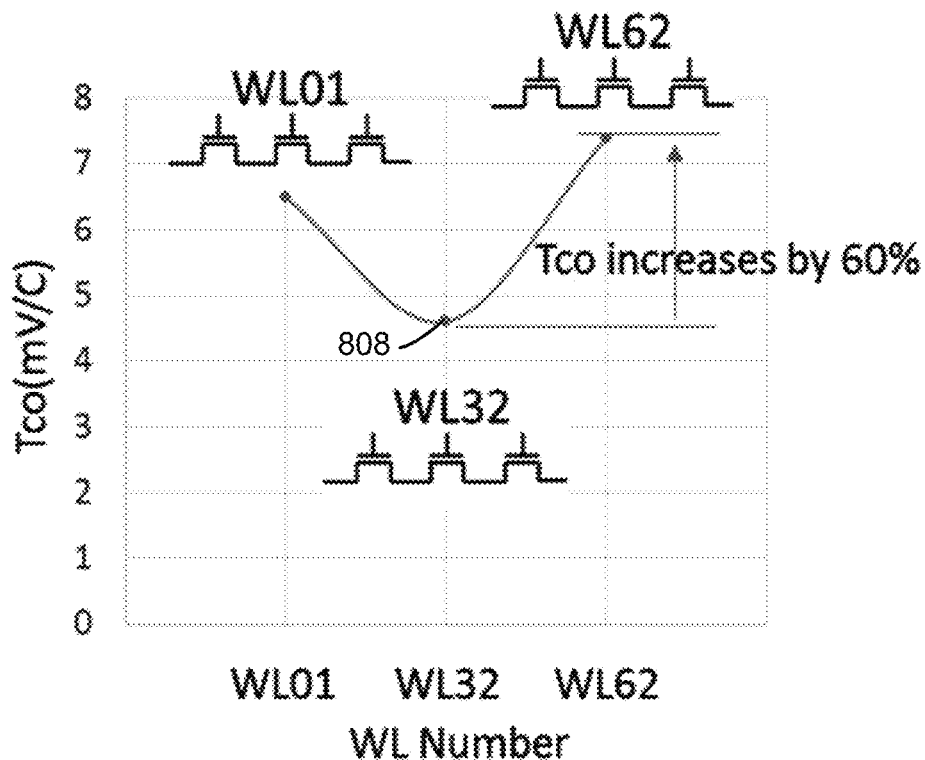
FIG. 8B depicts a graph of the change in threshold voltage per degree Celsius over word line location of memory cell transistors within a NAND string between word line WL01 near the source line end of the NAND string and word line WL62 near the bit line end of the NAND string.

FIG. 8B depicts a graph of the change in threshold voltage per degree Celsius over word line location of memory cell transistors within a NAND string. As depicted, the memory cell transistor associated with word line WL01 has a change in threshold voltage per degree Celsius of −6.5 mV per degree, the memory cell transistor associated with word line WL32 has a change in threshold voltage per degree Celsius of −4.7 mV per degree, and the memory cell transistor associated with word line WL62 has a change in threshold voltage per degree Celsius of −7.4 mV per degree. The minimum 808 change in threshold voltage per degree Celsius occurs in the middle of the NAND string (e.g., for word lines close to word line WL32).

Figure 8C:
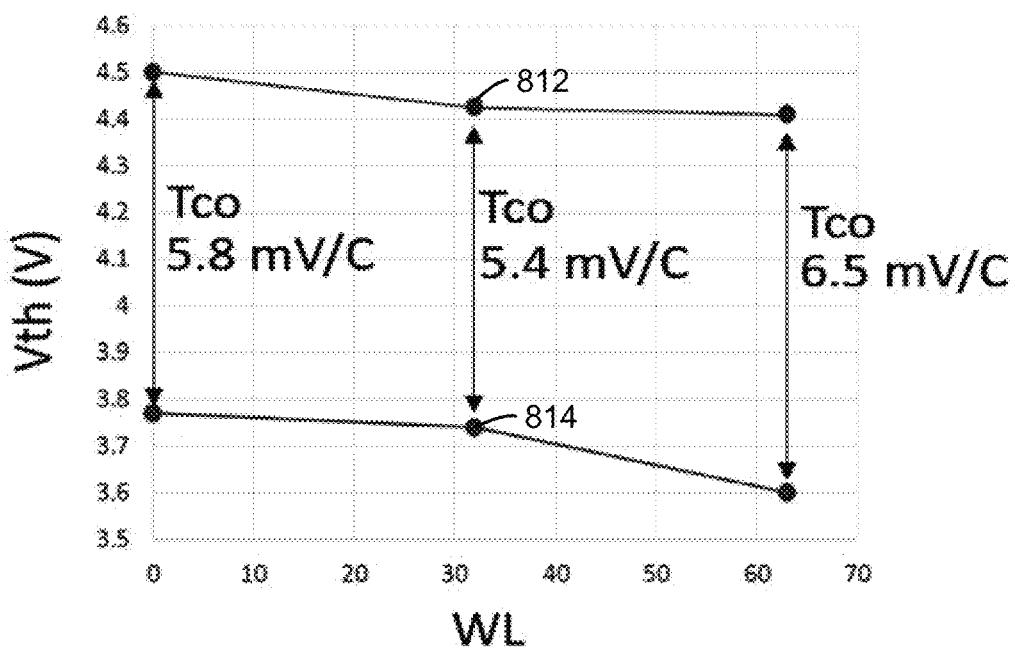
FIG. 8C depicts a graph of threshold voltages over word line location of memory cell transistors within a NAND string for two different temperatures.

FIG. 8C depicts a graph of threshold voltages over word line location of memory cell transistors within a NAND string for two different temperatures (e.g., at a hot temperature of 85 degrees Celsius and a cold temperature of −25 degrees Celsius). The two different temperatures may correspond with a hot temperature and a cold temperature less than the hot temperature. For word line WL0, the change in threshold voltage per degree Celsius is 5.8 mV per degree Celsius. For word line WL32, the change in threshold voltage per degree Celsius is 5.4 mV per degree Celsius and corresponds with the difference between the threshold voltage 812 for the cold temperature and the threshold voltage 814 for the hot temperature. For word line WL63, the change in threshold voltage per degree Celsius is 6.5 mV per degree Celsius. In this case, the minimum change in threshold voltage per degree Celsius occurs for the memory cell transistor connected to the word line WL32.

In some embodiments, the word line voltage applied to drain-side transistors of a selected memory cell transistor being read during a read operation may be a first word line voltage when the selected memory cell transistor is close to the bit line end of a NAND string (e.g., word line WL60), the first word line voltage when the selected memory cell transistor is close to the source line end of the NAND string (e.g., word line WL02), and a second word line voltage greater than the first word line voltage when the selected memory cell transistor is close to the middle of the NAND string (e.g., word line WL32). The increased word line voltage applied to the drain-side transistors of a selected memory cell transistor close to the middle of the NAND string may cause the stored threshold voltage of the selected memory cell transistor to be reduced due to DIBL.

Figure 8D:
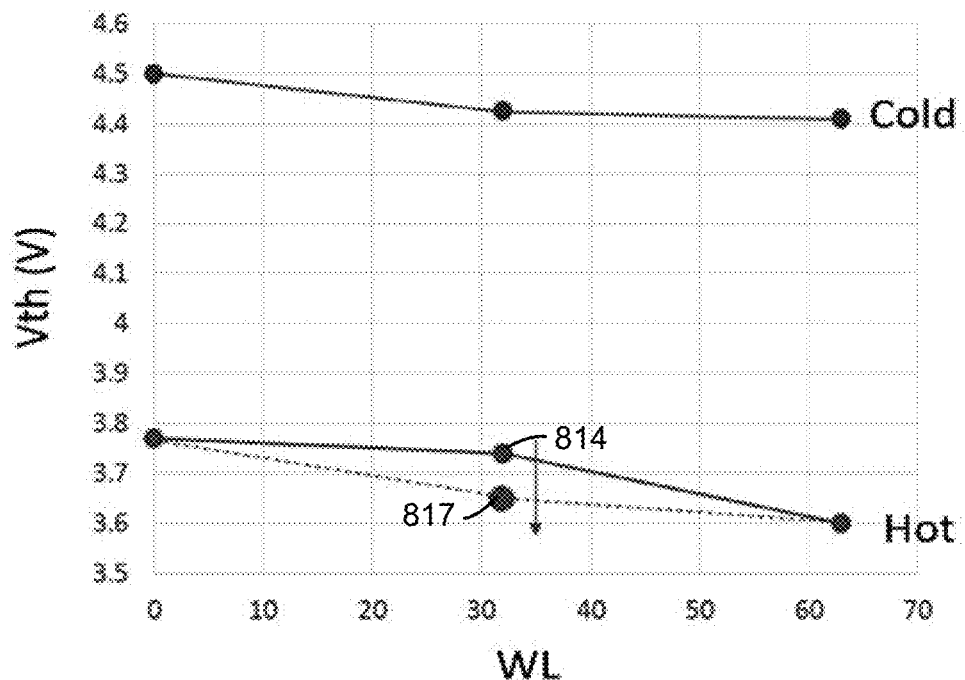
FIG. 8D depicts the graph of FIG. 8C in which the threshold voltages for a group of memory cell transistors in the middle of the NAND string have been shifted lower by increasing DIBL to those memory cell transistors.

FIG. 8D depicts the graph of FIG. 8C in which the threshold voltages for a group of memory cell transistors in the middle of the NAND string have been shifted lower by increasing DIBL to those memory cell transistors. As depicted, the threshold voltage 814 at the hot temperature in FIG. 8C has been shifted lower to the threshold voltage 817.

Figure 8E:
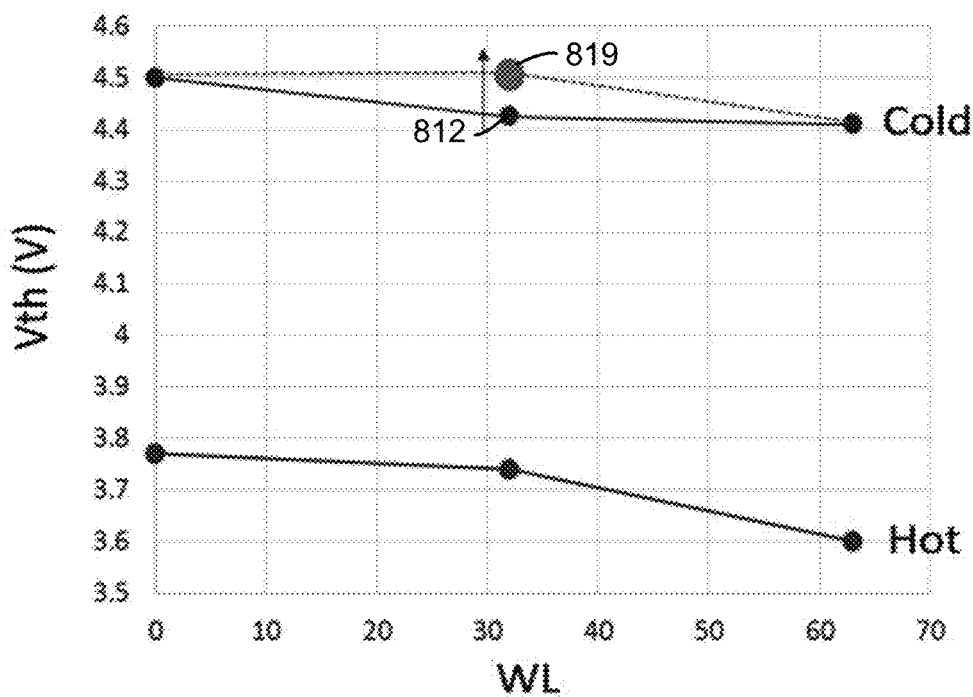
FIG. 8E depicts the graph of FIG. 8C in which the threshold voltages for a group of memory cell transistors in the middle of the NAND string have been shifted higher by increasing the source line voltage to those memory cell transistors.

FIG. 8E depicts the graph of FIG. 8C in which the threshold voltages for a group of memory cell transistors in the middle of the NAND string have been shifted higher by increasing the source line voltage to those memory cell transistors. As depicted, the threshold voltage 812 at the cold temperature in FIG. 8C has been shifted higher to the threshold voltage 819.

In some embodiments, a NAND string may include a first memory cell transistor and a second memory cell transistor (e.g., the memory cell transistor to be selected for reading) arranged between the first memory cell transistor and a third memory cell transistor of the NAND string. The first memory cell transistor may be on the drain-side of the second memory cell transistor or arranged between the second memory cell transistor and a bit line connection to the NAND string. The third memory cell transistor may be on the source-side of the second memory cell transistor or arranged between the second memory cell transistor and a source line connection to the NAND string. During a first sensing of the second memory cell transistor at a first point in time and a first temperature (e.g., at hot or 85 degrees Celsius), the control gate of the first memory cell transistor may be biased such that a threshold voltage of the second memory cell transistor is reduced during the first sensing of the second memory cell transistor. Subsequently, during a second sensing of the second memory cell transistor at a second point in time and a second temperature (e.g., at cold or 15 degrees Celsius), the control gate of the third memory cell transistor may be biased such that the threshold voltage of the second memory cell transistor is increased during the second sensing of the second memory cell transistor. The time between the first point in time and the second point in time may be minutes, hours, or days. Increasing the word line voltages biasing memory cell transistors on the drain-side of the second memory cell transistor may effectively reduce the stored threshold voltage for the second cell transistor due to drain-induced barrier lowering (DIBL). In this case, lowering the resistance on the drain-side of the second memory cell transistor may increase the drain voltage applied to the second memory cell transistor and lower the effective threshold voltage of the second memory cell transistor due to DIBL.

Referring to FIGS. 8D-8E, the range of the cold temperature (Cold) may be between −40 degrees Celsius and −25 degrees Celsius and the range of the hot temperature (Hot) may be between 85 degrees Celsius and 100 degrees Celsius. In one example, the cold temperature (Cold) depicted in FIGS. 8D-8E may be −40 degrees Celsius and the hot temperature (Hot) depicted in FIGS. 8D-8E may be 85 degrees Celsius.

Figure 8F:
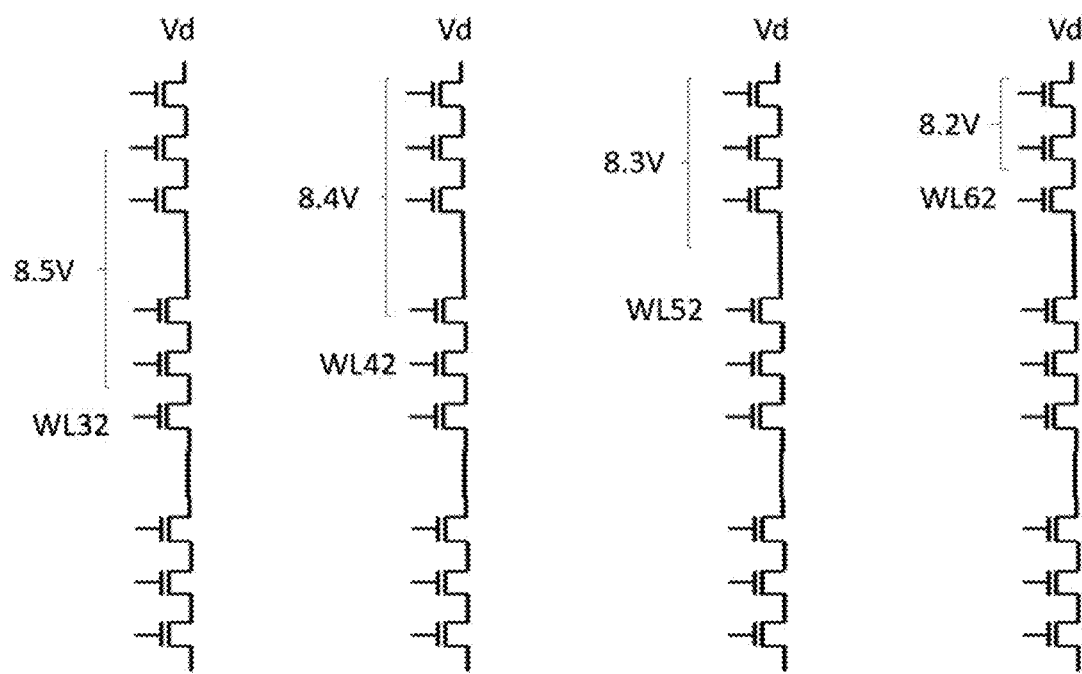
FIGS. 8F-8G depict the word line voltages applied to drain-side memory cell transistors of a selected memory cell during a read operation.
Figure 8G:
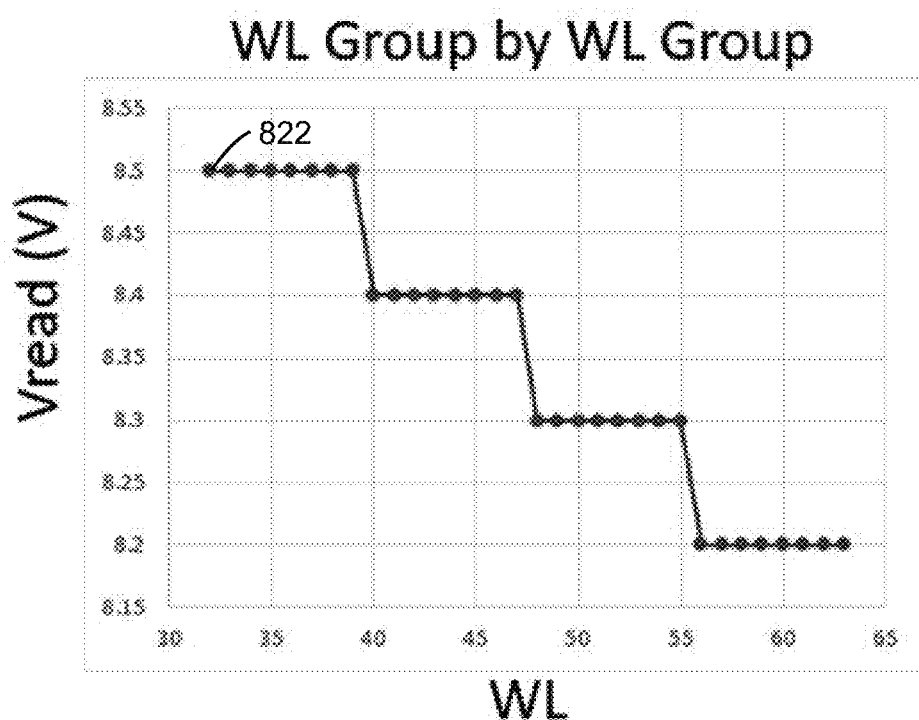

FIGS. 8F-8G depict the word line voltages applied to drain-side memory cell transistors of a selected memory cell during a read operation or a sensing operation (e.g., the memory cell transistor being sensed). The word line voltage applied to the drain-side memory cell transistors of a selected memory cell transistor may be referred to as VREAD. FIG. 8F depicts the word line voltages applied to the drain-side memory cell transistors of a selected memory cell transistor. For example, when word line WL32 is the selected word line, then the word line voltage applied to the drain-side memory cell transistors on the drain-side (e.g., towards the bit line connection to the NAND string) of the memory cell transistor connected to word line WL32 is 8.5V. When word line WL52 is the selected word line, then the word line voltage applied to the drain-side memory cell transistors on the drain-side of the memory cell transistor connected to word line WL52 is 8.3V.

Referring to FIG. 8G, when the selected memory cell transistor is associated with word line WL32, then the word line voltage 822 applied to the drain-side memory cell transistors of the selected memory cell is 8.5V. When the selected memory cell transistor is connected to a word line between WL32 and WL39, then the word line voltage applied to the drain-side memory cell transistors of the selected memory cell is 8.5V. When the selected memory cell transistor is connected to a word line between WL40 and WL47, then the word line voltage applied to the drain-side memory cell transistors of the selected memory cell is 8.4V. When the selected memory cell transistor is connected to a word line between WL48 and WL55, then the word line voltage applied to the drain-side memory cell transistors of the selected memory cell is 8.3V. When the selected memory cell transistor is connected to a word line between WL56 and WL63, then the word line voltage applied to the drain-side memory cell transistors of the selected memory cell is 8.2V.

Figure 8H:
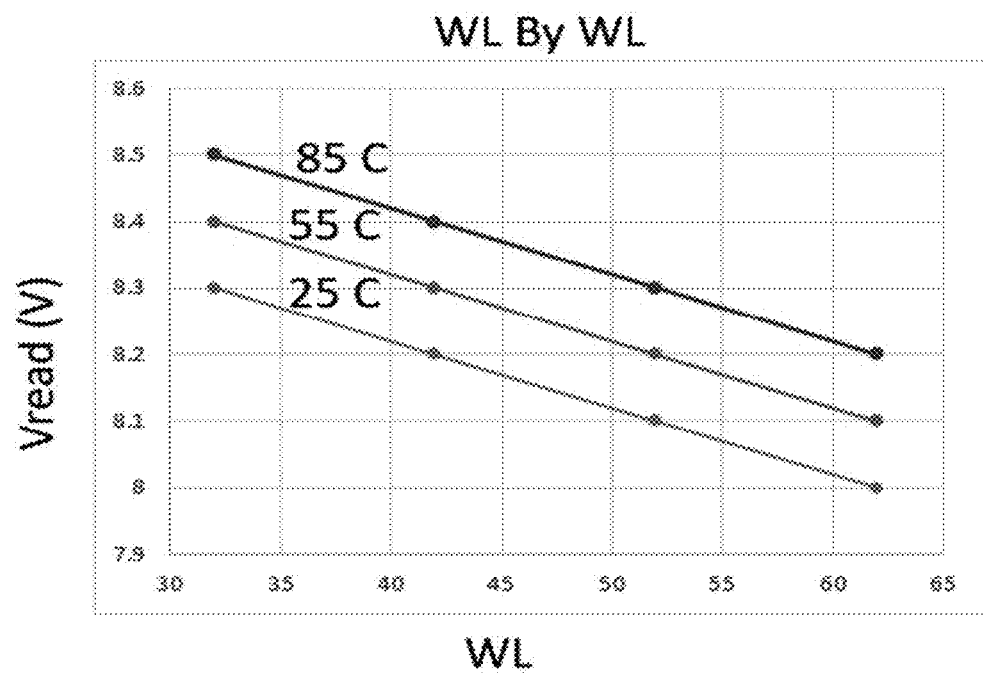
FIGS. 8H-8I depict the word line voltages applied to drain-side memory cell transistors of a selected memory cell during a read operation.
Figure 8I:
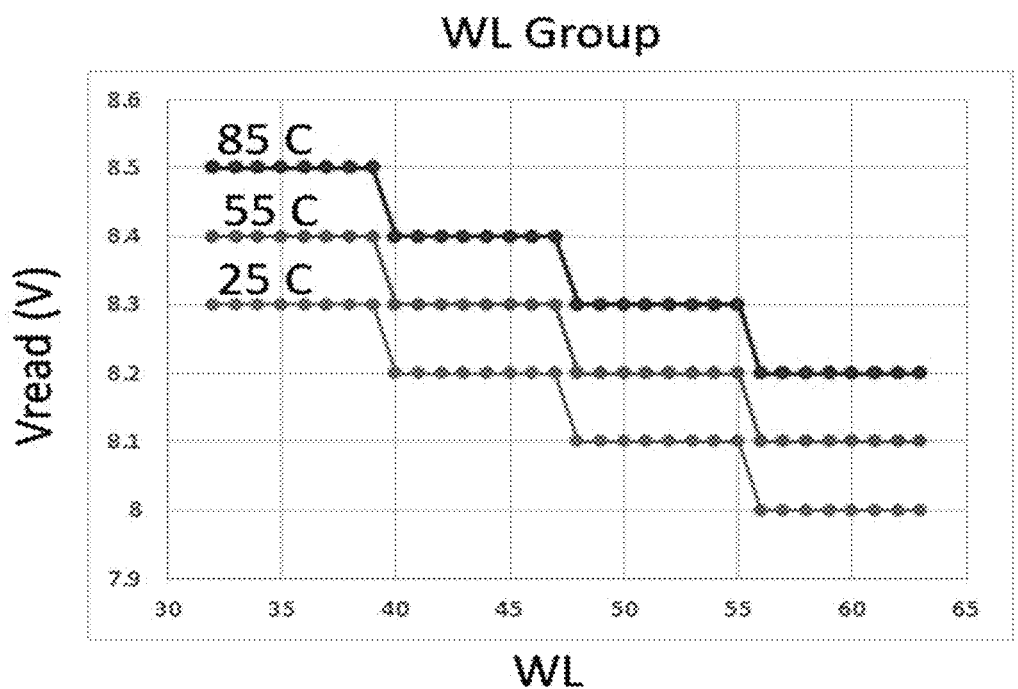

FIGS. 8H-8I depict the word line voltages applied to drain-side memory cell transistors of a selected memory cell during a read operation or a sensing operation over temperature. Referring to FIG. 8H, a linear function is used to determine which word line voltage is applied to the drain-side memory cell transistors of the selected memory cell. In one example, a lookup table may be used to store the mapping of word line location (or the word line number) and temperature to the appropriate word line voltage to apply to the drain-side memory cell transistors. FIG. 8I depicts four groupings of memory cell transistors and the appropriate word line voltage to apply to the drain-side memory cell transistors for three different read temperatures (85 degrees Celsius, 55 degrees Celsius, and 25 degrees Celsius). For example, for the memory cell transistor connected to word line WL45, if the read temperature is 55 degrees Celsius, then the VREAD applied to the drain-side transistors on the drain-side of the selected memory cell is 8.3V.

Figure 8J:
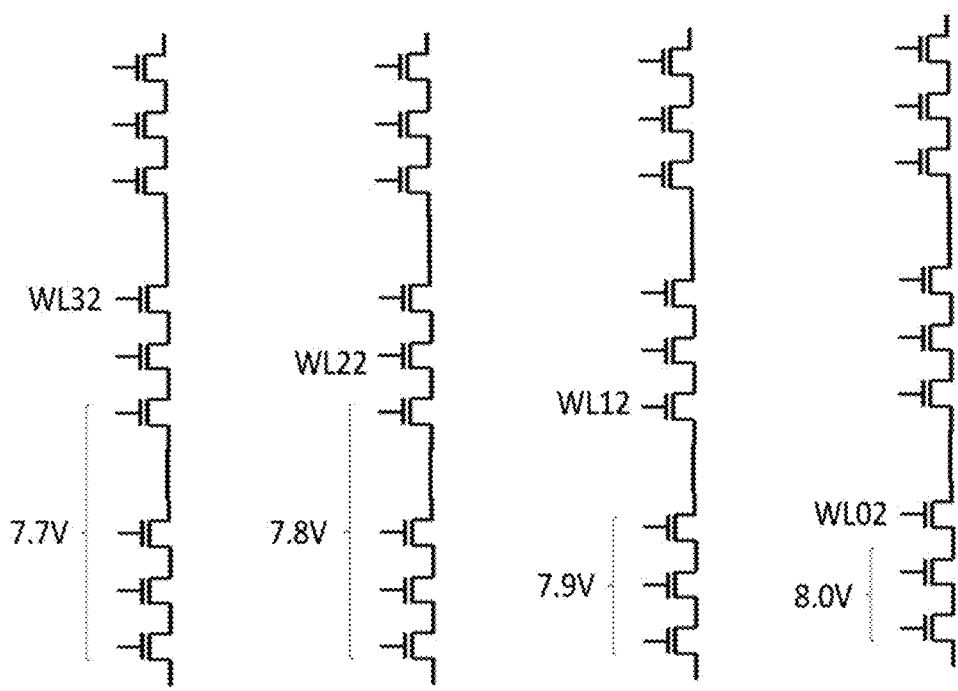
FIGS. 8J-8K depict the word line voltage applied to source-side memory cell transistors of a selected memory cell during a read operation.
Figure 8K:
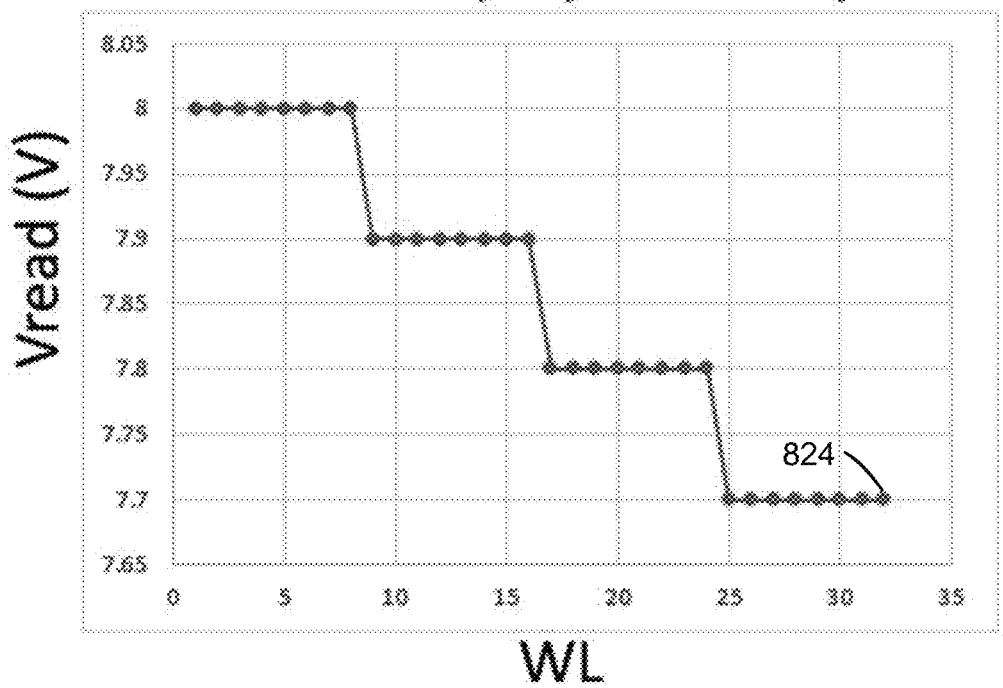

FIGS. 8J-8K depict the word line voltage applied to source-side memory cell transistors of a selected memory cell during a read operation or a sensing operation (e.g., the memory cell transistor being sensed). FIG. 8J depicts the word line voltages applied to the source-side memory cell transistors of a selected memory cell transistor. For example, when word line WL32 is the selected word line, then the word line voltage applied to the source-side memory cell transistors on the source-side (e.g., towards the source line connection of the NAND string) of the memory cell transistor connected to word line WL32 is 7.7V. When word line WL12 is the selected word line, then the word line voltage applied to the source-side memory cell transistors on the source-side of the memory cell transistor connected to word line WL12 is 7.9V.

Referring to FIG. 8K, when the selected memory cell transistor is associated with word line WL32, then the word line voltage 824 applied to the source-side memory cell transistors of the selected memory cell is 7.7V. When the selected memory cell transistor is connected to a word line between WL32 and WL25, then the word line voltage applied to the source-side memory cell transistors of the selected memory cell is 7.7V. When the selected memory cell transistor is connected to a word line between WL24 and WL17, then the word line voltage applied to the source-side memory cell transistors of the selected memory cell is 7.8V. When the selected memory cell transistor is connected to a word line between WL16 and WL09, then the word line voltage applied to the source-side memory cell transistors of the selected memory cell is 7.9V. When the selected memory cell transistor is connected to a word line between WL08 and WL01, then the word line voltage applied to the source-side memory cell transistors of the selected memory cell is 8.0V.

Figure 8L:
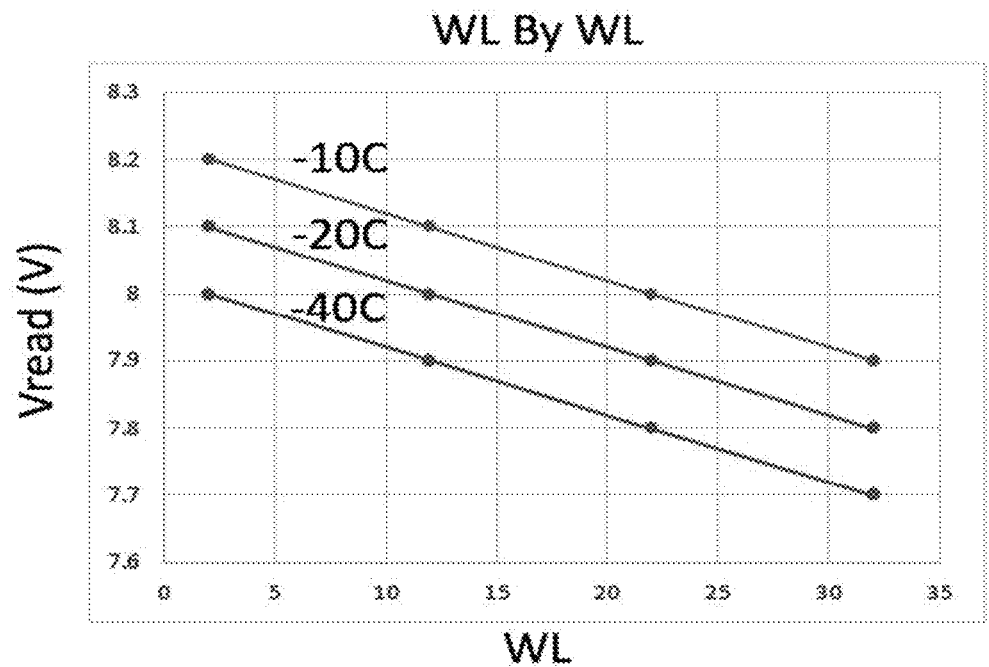
FIGS. 8L-8M depict the word line voltages applied to source-side memory cell transistors of a selected memory cell during a read operation.
Figure 8M:
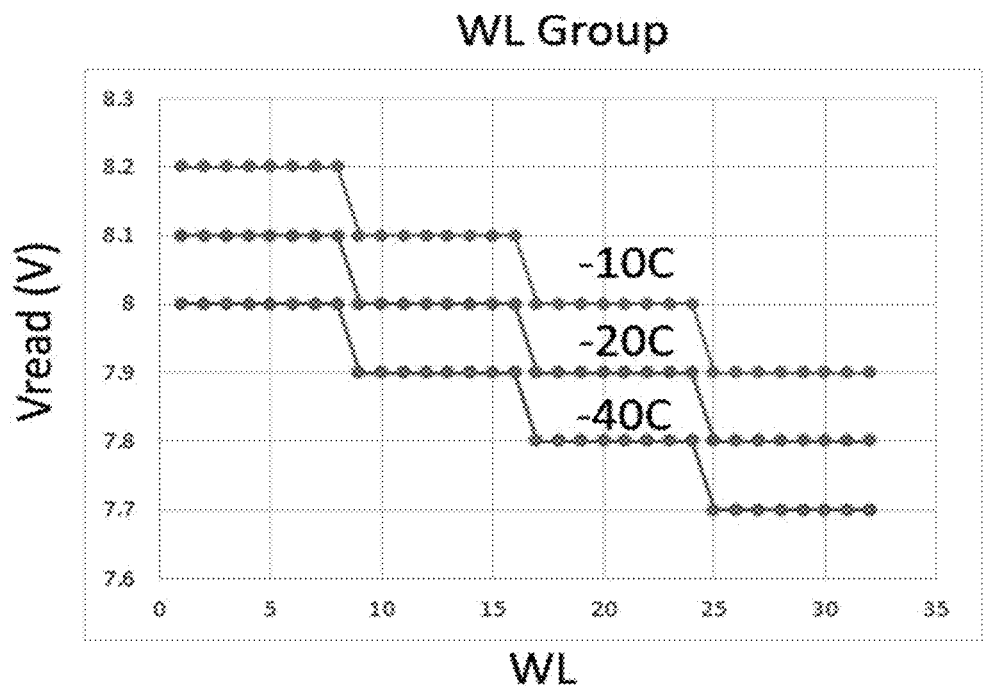

FIGS. 8L-8M depict the word line voltages applied to source-side memory cell transistors of a selected memory cell during a read operation or a sensing operation over temperature. Referring to FIG. 8L, a linear function is used to determine which word line voltage is applied to the source-side memory cell transistors of the selected memory cell. In one example, a lookup table may be used to store the mapping of word line location and temperature to the appropriate word line voltage to apply to the source-side memory cell transistors. FIG. 8M depicts four groupings of memory cell transistors and the appropriate word line voltage to apply to the source-side memory cell transistors for three different read temperatures (−10 degrees Celsius, −20 degrees Celsius, and −40 degrees Celsius). For example, for the memory cell transistor connected to word line WL10, if the read temperature is −20 degrees Celsius, then the voltage applied to the source-side transistors on the source-side of the selected memory cell is 8.0V.

Figure 9A:
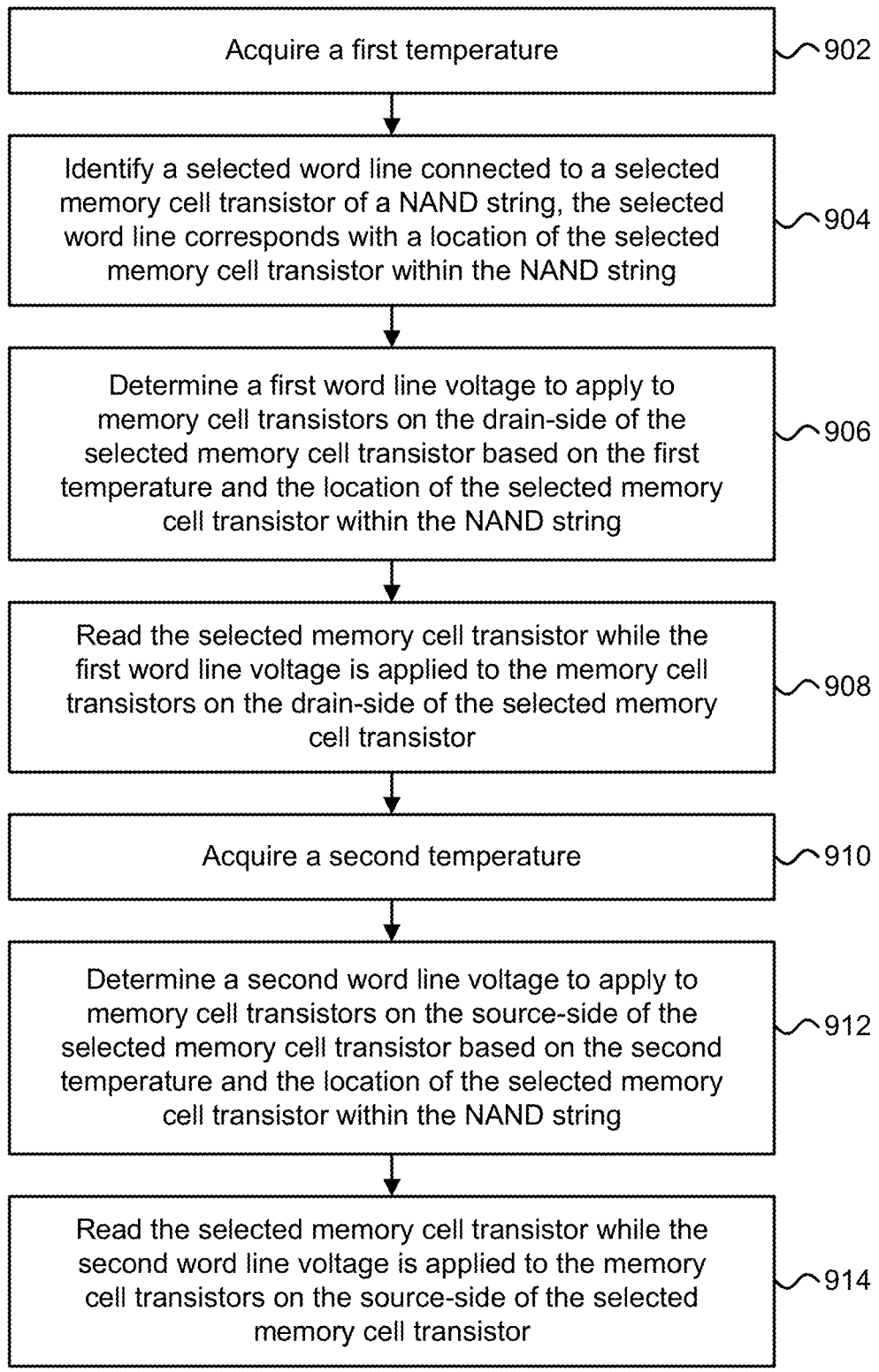
FIG. 9A is a flowchart describing one embodiment of a process for performing a sensing operation, such as a read operation.

FIG. 9A is a flowchart describing one embodiment of a process for performing a sensing operation, such as a read operation. In one embodiment, the process of FIG. 9A may be performed by a non-volatile storage system, such as non-volatile storage system 596 in FIG. 5.

In step 902, a first temperature is acquired. The first temperature may correspond with reading a selected memory cell transistor and determining a data state corresponding with the stored threshold voltage for the selected memory cell transistor at a first point in time. The selected memory cell transistor may have been previously programmed to the stored threshold voltage during a prior programming operation. In step 904, a selected word line connected to a selected memory cell transistor of a NAND string is identified. The selected word line may correspond with a location of the selected memory cell transistor within the NAND string. In one example, the selected word line may comprise a word line near the middle of the NAND string (e.g., word line WL32 for a NAND string with 64 memory cell transistors). The selected word line may bias the gate of the selected memory cell transistor to a selected word line voltage in order to determine a data state of the selected memory cell transistor. In step 906, a first word line voltage to apply to memory cell transistors on the drain-side of the selected memory cell transistor is determined based on the first temperature and the location of the selected memory cell transistor within the NAND string. In one example, the first word line voltage may correspond with the word line voltage 822 in FIG. 8G. The first word line voltage may be determined via a lookup table stored in a non-volatile memory.

In step 908, the selected memory cell transistor is read while the first word line voltage is applied to the memory cell transistors on the drain-side of the selected memory cell transistor. In one example, reading the selected memory cell transistor while the first word line voltage is applied to the memory cell transistors on the drain-side of the selected memory cell transistor may cause the stored threshold voltage for the selected memory cell transistor to be reduced. Similarly, the threshold voltage 814 at the hot temperature in FIG. 8D has been shifted lower to the threshold voltage 817 due to increased DIBL.

In step 910, a second temperature is acquired. The second temperature may correspond with reading the selected memory cell transistor and determining a data state corresponding with the stored threshold voltage for the selected memory cell transistor at a second point in time subsequent to the first point in time. The second temperature may be less than or greater than the first temperature. The second temperature may correspond with a cold temperature and the first temperature may correspond with a hot temperature. In step 912, a second word line voltage to apply to memory cell transistors on the source-side of the selected memory cell transistor is determined based on the second temperature and the location of the selected memory cell transistor within the NAND string. In one example, the second word line voltage may correspond with the word line voltage 824 in FIG. 8K. The second word line voltage may be determined via a lookup table stored in a non-volatile memory.

In step 914, the selected memory cell transistor is read while the second word line voltage is applied to the memory cell transistors on the source-side of the selected memory cell transistor. In one example, reading the selected memory cell transistor while the second word line voltage is applied to the memory cell transistors on the source-side of the selected memory cell transistor may cause the stored threshold voltage for the selected memory cell transistor to be increased. Similarly, the threshold voltage 812 at the cold temperature in FIG. 8E has been shifted higher to the threshold voltage 819. Thus, for the same memory cell transistor, the threshold voltage may be shifted lower at the first temperature and shifted higher at the second temperature in order to make the shifting in stored threshold voltage over temperature independent of word line location and more uniform.

In some embodiments, a non-volatile storage system or a NAND memory device that includes the NAND string may detect that the difference between the first temperature and the second temperature is greater than a temperature threshold (e.g., the difference is greater than 60 degrees Celsius) or detect that that a read temperature is greater than the first temperature or less than the second temperature. In response, the storage system may enable compensation of threshold voltages over temperature based on word line location (e.g., enable threshold voltage compensation for memory cell transistors between word lines WL22 and WL42) by performing the steps of FIG. 9A or 9B during subsequent read operations to the NAND string.

Figure 9B:
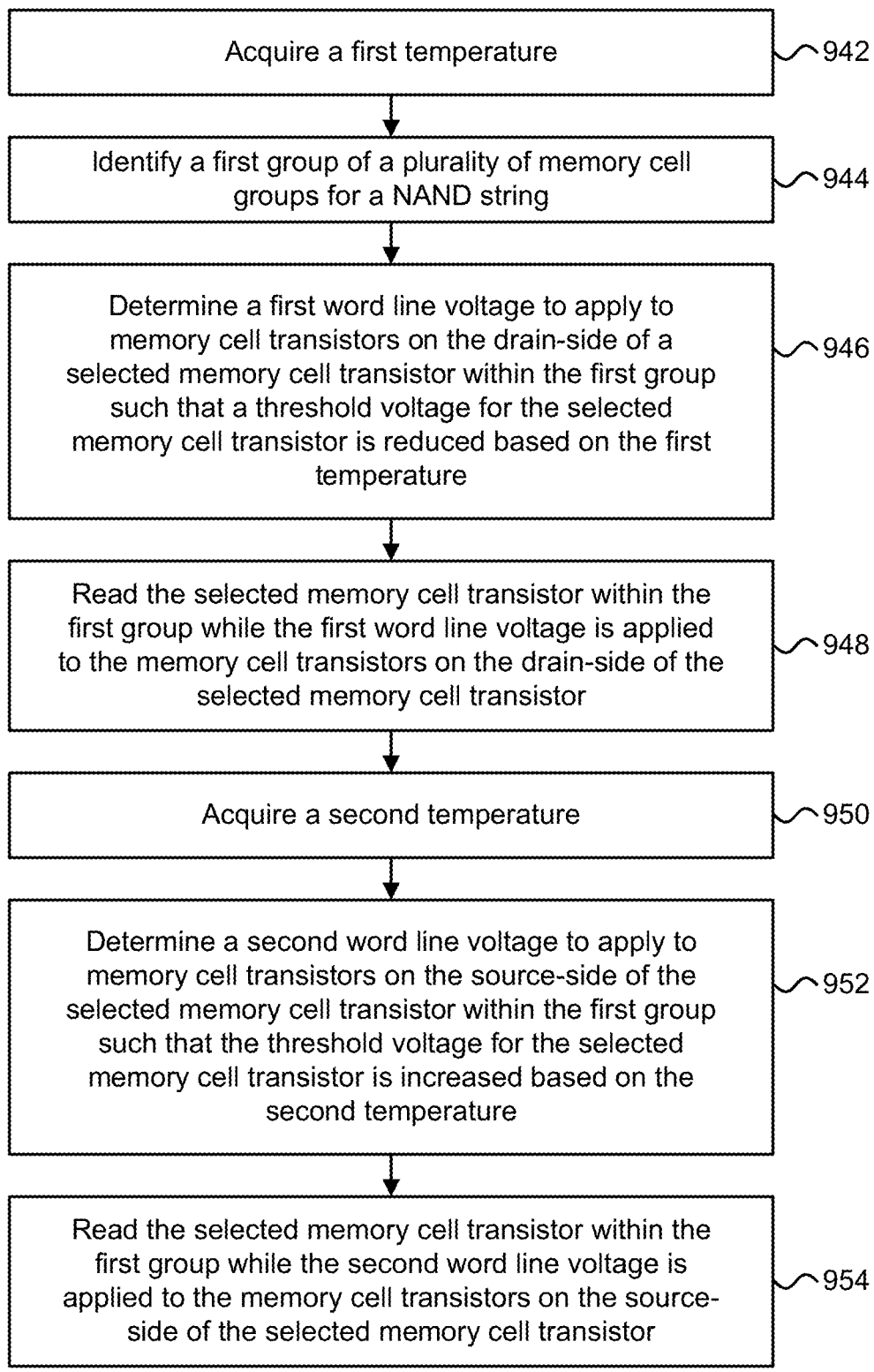
FIG. 9B is a flowchart describing another embodiment of a process for performing a sensing operation, such as a read operation.

In one example, the storage system may detect that a read temperature has exceeded an upper temperature threshold (e.g., is greater than 70 degrees Celsius) and enable the process of either FIG. 9A or 9B in response to detection that that the read temperature has exceeded the upper temperature threshold. In another example, the storage system may detect that a read temperature is less than a lower temperature threshold (e.g., is less than 15 degrees Celsius) and enable the process of either FIG. 9A or 9B in response to detection that that the read temperature is less than the lower temperature threshold. In another example, the storage system may detect that a temperature sensor for the system has experienced more than a 60 degree change in temperature from when data was written to the memory cells and in response enable the process of either FIG. 9A or 9B in response to detection that the temperature sensor for the system has experienced more than a 60 degree change in temperature.

FIG. 9B is a flowchart describing another embodiment of a process for performing a sensing operation, such as a read operation. In one embodiment, the process of FIG. 9B may be performed by a non-volatile storage system, such as non-volatile storage system 596 in FIG. 5.

In step 942, a first temperature is acquired. In step 944, a first group of a plurality of memory cell groups for a NAND string is identified. In one example, the first group may correspond with the group of word lines WL40 through WL47 in FIG. 8G that are to be assigned a VREAD voltage of 8.4V. The first group of correspond with a middle grouping of memory cell transistors between the ends of the NAND string. In step 946, a first word line voltage to apply to memory cell transistors on the drain-side of the selected memory cell transistor within the first group such that a threshold voltage for the selected memory cell transistor is reduced is determined based on the first temperature. In step 948, the selected memory cell transistor within the first group is read while the first word line voltage is applied to the memory cell transistors on the drain-side of the selected memory cell transistor.

In step 950, a second temperature is acquired. In step 952, a second word line voltage to apply to memory cell transistors on the source-side of the selected memory cell transistor within the first group such that the threshold voltage for the selected memory cell transistor is increased is determined based on the second temperature. In step 954, the selected memory cell transistor within the first group is read while the second word line voltage is applied to the memory cell transistors on the source-side of the selected memory cell transistor.

One embodiment of the disclosed technology includes a control circuit, a sensing circuit, and a NAND string including a first memory cell transistor and a second memory cell transistor arranged between the first memory cell transistor and a third memory cell transistor of the NAND string. The control circuit configured to bias the first memory cell transistor such that a threshold voltage of the second memory cell transistor is reduced during a first sensing of the second memory cell transistor at a first temperature. The control circuit configured to bias the third memory cell transistor such that the threshold voltage of the second memory cell transistor is increased during a second sensing of the second memory cell transistor at a second temperature different from the first temperature. The sensing circuit configured to sense the second memory cell transistor during the first sensing of the second memory cell transistor and sense the second memory cell transistor during the second sensing of the second memory cell transistor.

One embodiment of the disclosed technology includes one or more control circuits and a NAND string including a set of memory cell transistors. The set of memory cell transistors includes a selected memory cell transistor. The one or more control circuits configured to acquire a first temperature and determine a first word line voltage for a first set of memory cell transistors on the drain-side of the selected memory cell transistor based on the first temperature and a location of the selected memory cell transistor within the NAND string. The one or more control circuits configured to sense the selected memory cell transistor while the first word line voltage is applied to the first set of memory cell transistors on the drain-side of the selected memory cell transistor to reduce a threshold voltage of the selected memory cell transistor. The one or more control circuits configured to acquire a second temperature and determine a second word line voltage for a second set of memory cell transistors on the source-side of the selected memory cell transistor based on the second temperature and the location of the selected memory cell transistor within the NAND string. The one or more control circuits configured to sense the selected memory cell transistor while the second word line voltage is applied to the second set of memory cell transistors on the source-side of the selected memory cell transistor to increase the threshold voltage of the selected memory cell transistor.

One embodiment of the disclosed technology includes determining a first temperature of a NAND string at a first point in time. The NAND string includes a first memory cell transistor and a second memory cell transistor arranged between the first memory cell transistor and a third memory cell transistor of the NAND string.

The method further comprises biasing the first memory cell transistor such that a threshold voltage of the second memory cell transistor is reduced during a first sensing of the second memory cell transistor. The method further comprises sensing the second memory cell transistor during the first sensing of the second memory cell transistor and determining a second temperature of the NAND string at a second point in time subsequent to the first point in time. In some cases, the second temperature may be less than the first temperature.

The method further comprises biasing the third memory cell transistor such that the threshold voltage of the second memory cell transistor is increased during a second sensing of the second memory cell transistor and sensing the second memory cell transistor during the second sensing of the second memory cell transistor.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
 a sensing circuit configured to be in communication with a NAND string, the NAND string includes a first group of memory cell transistors and a second group of memory cell transistors, the first group of memory cell transistors includes a first memory cell transistor and the second group of memory cell transistors includes a second memory cell transistor; and
 one or more control circuits configured to be in communication with the NAND string, the one or more control circuits are configured to bias memory cell transistors of the first group of memory cell transistors on a drain-side of the first memory cell transistor such that a sensed threshold voltage of the first memory cell transistor is decreased during a first sensing operation for the first memory cell transistor, the one or more control circuits are configured to bias memory cell transistors of the second group of memory cell transistors on a source-side of the second memory cell transistor such that a sensed threshold voltage of the second memory cell transistor is increased during a second sensing operation for the second memory cell transistor.

2. The apparatus of claim 1, wherein:
the sensing circuit is configured to determine a data state of the first memory cell transistor during the first sensing operation.

3. The apparatus of claim 2, wherein:
the one or more control circuits are configured to apply a first unselected word line voltage to control gates of the memory cell transistors on the drain-side of the first memory cell transistor while the data state of the first memory cell transistor is determined.

4. The apparatus of claim 3, wherein:
the sensing circuit is configured to determine a data state of the second memory cell transistor during the second sensing operation.

5. The apparatus of claim 4, wherein:
the one or more control circuits are configured to apply a second unselected word line voltage to control gates of the memory cell transistors on the source-side of the second memory cell transistor while the data state of the second memory cell transistor is determined, the second unselected word line voltage is less than the first unselected word line voltage.

6. The apparatus of claim 1, wherein:
the sensing circuit is configured to sense a current flowing through the first memory cell transistor while a first unselected word line voltage is applied to the memory cell transistors on the drain-side of the first memory cell transistor.

7. The apparatus of claim 6, wherein:
the sensing circuit is configured to sense a current flowing through the second memory cell transistor while a second unselected word line voltage is applied to the memory cell transistors on the source-side of the second memory cell transistor, the second unselected word line voltage is less than the first unselected word line voltage.

8. The apparatus of claim 1, wherein:
the first memory cell transistor comprises one of a floating-gate transistor or a charge trap transistor.

9. The apparatus of claim 1, wherein:
the sensing circuit is arranged on a first die; and
the NAND string is arranged on a second die.

10. The apparatus of claim 1, wherein:
the one or more control circuits are configured to determine a data state of the first memory cell transistor based on the sensed threshold voltage of the first memory cell transistor.

11. A method, comprising:
detecting that a sensed threshold voltage of a first memory cell transistor of a NAND string should be decreased during a first sensing operation;
determining a first unselected word line voltage to be applied to memory cell transistors of the NAND string on a drain-side of the first memory cell transistor;
determining a data state for the first memory cell transistor while the first unselected word line voltage is applied to the memory cell transistors on the drain-side of the first memory cell transistor during the first sensing operation;
detecting that a sensed threshold voltage of a second memory cell transistor of the NAND string should be increased during a second sensing operation;

determining a second unselected word line voltage to be applied to memory cell transistors of the NAND string on a source-side of the second memory cell transistor; and determining a data state for the second memory cell transistor while the second unselected word line voltage is applied to the memory cell transistors on the source-side of the second memory cell transistor during the second sensing operation, the second unselected word line voltage is less than the first unselected word line voltage.

12. The method of claim 11, wherein:
the second memory cell transistor is arranged between the first memory cell transistor and a source line connection to the NAND string.

13. The method of claim 12, wherein:
the first memory cell transistor is arranged between the second memory cell transistor and a bit line connection to the NAND string.

14. The method of claim 11, wherein:
the NAND string comprises a vertical NAND string; and
the first sensing operation comprises a read operation.

15. An apparatus, comprising:
one or more control circuits configured to be in communication with a NAND string, the NAND string including a first group of memory cell transistors and a second group of memory cell transistors, the first group of memory cell transistors includes a first memory cell transistor and the second group of memory cell transistors includes a second memory cell transistor, the one or more control circuits are configured to determine a data state of the first memory cell transistor while memory cell transistors of the first group of memory cell transistors on a drain-side of the first memory cell transistor is biased to decrease a sensed threshold voltage of the first memory cell transistor and determine a data state of the second memory cell transistor while memory cell transistors of the second group of memory cell transistors on a source-side of the second memory cell transistor is biased to increase a sensed threshold voltage of the second memory cell transistor.

16. The apparatus of claim 15, wherein:
the second memory cell transistor is arranged between the first memory cell transistor and a source line connection to the NAND string.

17. The apparatus of claim 16, wherein:
the first memory cell transistor is arranged between the second memory cell transistor and a bit line connection to the NAND string.

18. The apparatus of claim 17, wherein:
the first memory cell transistor is adjacent to the second memory cell transistor.

19. The apparatus of claim 15, further comprising:
a sensing circuit configured to sense a current flowing through the first memory cell transistor and determine the data state of the first memory cell transistor based on the current flowing through the first memory cell transistor.

20. The apparatus of claim 19, wherein:
the sensing circuit is configured to sense a current flowing through the second memory cell transistor and determine the data state of the second memory cell transistor based on the current flowing through the second memory cell transistor.

* * * * *